(12) United States Patent
Mukhtar et al.

(10) Patent No.: US 7,129,863 B1
(45) Date of Patent: Oct. 31, 2006

(54) INTERVAL MODULATION CODING

(75) Inventors: Saleem Mukhtar, Pasadena, CA (US); Jehoshua Bruck, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 1093 days.

(21) Appl. No.: 10/163,080

(22) Filed: Jun. 3, 2002

Related U.S. Application Data

(60) Provisional application No. 60/295,495, filed on Jun. 1, 2001.

(51) Int. Cl.
*H03M 7/00* (2006.01)
(52) U.S. Cl. .......................... 341/79; 341/58; 341/65; 341/67; 341/68; 341/80
(58) Field of Classification Search ................ 341/58, 341/65, 67, 68, 75, 79, 80
See application file for complete search history.

(56) References Cited

U.S. PATENT DOCUMENTS

| | | | | |
|---|---|---|---|---|
| 5,151,697 | A * | 9/1992 | Bunton ........................ | 341/51 |
| 5,216,423 | A * | 6/1993 | Mukherjee .................... | 341/79 |
| 5,534,861 | A * | 7/1996 | Chang et al. ................ | 341/79 |
| 5,973,626 | A * | 10/1999 | Berger et al. ................ | 341/65 |
| 6,188,797 | B1 * | 2/2001 | Moledina et al. ........... | 382/246 |
| 6,563,439 | B1 * | 5/2003 | Acharya et al. ............. | 341/65 |

OTHER PUBLICATIONS

Complexity of the Variable Length Encoding Problem, Proc. 6th Southeast Conf. on Combinatorics, Graph Theory and Computing, Congressus Numerantium XIV, Utilitas Mathematica Publishing, Winnepeg, MB, Canada, at 211-244 (1975), unknown date.

Fourer, Robert and Gregory, John W., "Linear Programming FAQ" (1997). World Wide Web http://www.mcs.anl.gov/home/otc/faq/linear-programming-faq.html, Usenet sci.answers, anonymous FTP/pub/usenet/sci.answers/linear-programming-faw from rtfm.mit.edu, unknown date.

(Continued)

*Primary Examiner*—Rexford Barnie
*Assistant Examiner*—Khai M. Nguyen
(74) *Attorney, Agent, or Firm*—Townsend and Townsend and Crew

(57) ABSTRACT

The design of communication and storage systems requires a choice of modulation and coding. In conventional storage and communication systems, the commonly used modulation scheme is called Non Return to Zero (NRZ) and the commonly used codes are called Run Length Limited (RLL) codes. The disclosure describes a new modulation scheme that can be used to increase the data transmission rate or storage density. The disclosure also describes codes that are referred to as Interval Modulation Codes, which can be used to transmit or store information efficiently using the new modulation scheme. Also described are procedures for determining if there exist suitable Interval Modulation Codes, given predetermined parameters that describe their desired performance. The disclosure also describes procedures or algorithms for constructing optimal Interval Modulation Codes given a set of parameters that describe their performance. The described techniques can be used in different communication (e.g. fiber optical, wireless, wireline, etc.) and storage (e.g. magnetic, optical, etc.) systems.

66 Claims, 11 Drawing Sheets

OTHER PUBLICATIONS

Golin et al., "Prefix Codes: Equiprobable Words, Unequal Letter Costs", SIAM J. Computing, vol. 25, No. 6 at 1281-1292 (1996), unknown date.

Huffman, "A Method for the Construction of Minimum Redundancy Codes", Proceedings of the IRE, vol. 40, No. 9 at 1098-1101 (1952), unknown date.

Kapoor et al., "Optimum Lopsided Binary Trees", J. ACM, vol. 36, No. at 573-590 (1989), unknown date.

Perl et al., "Efficient Generation of Optimal Prefix Code: Equiprobable Words Using Unequal Cost Letters", J. ACM, vol. 22, No. 2 at 202-214 (1975), unknown date.

"Tunstall in Synthesis of Noiseless Compression Codes", thesis at Georgia Institute of Technology (1967), no month.

Varn, "Optimal Variable Length Codes", Inf. Control, vol. 19, No. 4, at 289-301 (1971), unknown date.

* cited by examiner

INTERVAL MODULATION CODING

REFERENCE TO PRIORITY DOCUMENT

This application claims priority of co-pending U.S. Provisional Patent Application Ser. No. 60/295,495 entitled "Method and Apparatus for Efficient Representation, Encoding and Decoding of Data for Asynchronous Communication and Storage" by S. Mukhtar and J. Bruck, filed Jun. 1, 2001. Priority of the filing date of Jun. 1, 2001 is hereby claimed, and the disclosure of the Provisional Patent Application is hereby incorporated by reference.

BACKGROUND OF THE INVENTION

1. Field of the Invention

This invention relates to modulation schemes and codes that can be used to design data storage and data transmission systems.

2. Description of the Related Art

The design of communication and storage systems requires a choice of modulation and coding. In conventional storage and communication systems, the most commonly used modulation scheme is called Non Return to Zero (NRZ), described further below. Systems based on NRZ modulation use special codes to represent data. The most commonly used codes are called Run Length Limited (RLL) codes, and are also described further below.

A. NRZ (Non Return to Zero) Modulation

In data storage systems and data communication systems, data is stored or transmitted through the modulation of some physical quantity. In the context of data storage in magnetic media, the modulated quantity is the polarity of bar magnets that are created on the magnetic media by a write head. For data storage in recordable optical media, the quantity that is modulated to store data is the disc reflectivity. In the context of fiber optic modulation, the quantity that is modulated in order to transmit data is intensity of a laser beam. In the context of wireless communication, the quantity that is modulated to transmit data is either the frequency, amplitude, or phase of a radio frequency (RF) signal. In wire line communication, the physical quantity that is modulated in order to transmit data is voltage of a signal.

For purposes of storage and communication in the above contexts, different modulation schemes can be used. The most commonly used modulation scheme is called Non Return to Zero (NRZ). The salient feature of NRZ is that the signal is binary (has two states) and state transitions can occur only at regular periods in time. Thus the time between any two transitions is always an integer multiple of some time constant as is illustrated in FIG. 1a. The modulated signal waveform 102 in FIG. 1a is shown with the horizontal axis 104 representing time and the vertical axis 106 representing the modulated physical quantity. NRZ signals can be used to represent binary data using two different conventions. In the first convention, one of the two states corresponds to a logical zero and the other corresponds to a logical one. This is illustrated in FIG. 1b. In the second convention, a state transition is used to represent a logical one and the absence of a state transition is used to represent a logical zero. This is illustrated in FIG. 1c. It should be noted that all binary signals can be uniquely represented by NRZ signals using either convention. In the rest of this document, the later convention will be used.

B. RLL (Run Length Limited) Codes

Communication and storage systems that use NRZ modulation are based on clocked circuits. In order to map the modulated quantity to binary data, one needs to sample the modulated quantity at regular periodic intervals in time. An internal clock determines these sampling points. Due to practical limitations, the internal clock usually has some error (in clock period). The clock error causes the difference between the points in time at which the signal is to be sampled versus the points in time at which the signal is actually sampled to increase with time. This phenomenon is referred to as clock drift. This problem is typically accommodated by means of a phased lock loop that resynchronizes the internal clock with the NRZ modulated signal every time there is a transition in the modulated quantity. To ensure proper functioning of the clock circuit, constraints are placed on the binary sequence in order to ensure that there will be at least one transition within some fixed period of time. Such constraints can be characterized as limiting the maximum number of zeros (represented by "k") between any two adjacent ones. Other engineering constraints may also force a limitation on the minimum number of zeros (represented by "d") between two adjacent ones. To transmit data using NRZ modulation in the presence of the above constraints, one generally uses [d, k] run length limited (RLL) codes. RLL codes are one coding mechanism for mapping arbitrary binary sequences to longer sequences that satisfy the constraints mentioned above in a unique and efficient manner. Because the mapping (encoding) is unique, an inverse of the code is used for decoding. In this way, the original binary data can be recovered.

For example, one scheme used in the context of magnetic data storage is referred to as a [2, 7] code, because the code ensures that any consecutive data one bits in an unconstrained (input) signal are mapped to a sequence in which adjacent one bits are separated by at least two zero bits, but no more than seven consecutive zero bits. Thus, the set of permissible time intervals from one signal transition to the next for the [2, 7] code is the code symbol set S of consecutive integer multiples of a clock period, where S is specified by Table 1:

TABLE 1

S = {3, 4, 5, 6, 7, 8}

In other words, the minimum number of time intervals from one transition to the next is three, which occurs where data is encoded as the sequence "1001", and the maximum number of time intervals permitted is eight, which occurs where data is encoded as "100000001". A data device employing a [2, 7] code will map the unconstrained (not yet encoded) bits of a data packet to a bit sequence that is constrained in accordance with the [2, 7] code.

All the factors mentioned above influence the design of data transmission systems like optical and wireless transceivers and data storage systems like magnetic and optical disk drives. Most RLL codes map a block of data bits into a fixed number of constrained data bits, such as mapping all combinations of three unconstrained bits into blocks of five bits, comprising a fixed-length-to-fixed-length code. Other known coding schemes provide a variable length to fixed block code, or block to variable length code.

The present invention provides a different modulation scheme and proposes new codes that can be used to transmit or store data efficiently using the proposed modulation scheme.

SUMMARY OF THE INVENTION

In the most commonly used modulation scheme (called non return to zero, or NRZ), the elapsed time between transitions is restricted to be integer multiples of half the clock period. The present invention provides a modulation scheme in which the time between transitions belongs to a finite set of symbols that are not required to be consecutive integer multiples of a predetermined constant. The duration of the symbols can be chosen in accordance with a probabilistic model of measurement error. The data intervals are non-uniform and can be specified such that they produce a constant symbol error rate. Since the set of symbols is finite, and the duration of the largest symbol is finite, and the symbols have been chosen in accordance with a probabilistic model of measurement error, the need for run length limited codes has been eliminated.

However, in order to transmit data efficiently using the proposed modulation scheme, sophisticated coding techniques are desired. The present invention also provides a coding scheme that maps unconstrained bits to non-uniform symbols and a decoding scheme that maps non-uniform symbols back to unconstrained bits. The proposed modulation scheme in conjunction with the proposed codes can be used to provide more efficient storage and communication systems. The proposed codes use variable-length-to-variable-length prefix-free codes to map bits to symbols in a one-on-one manner. Such codes will be referred to as Interval Modulation Codes.

Given a code symbol set S of non-uniform intervals, a selected encoder delay time $T_E$, a selected decoder delay time $T_D$, and a desired data transfer rate R, a coding mechanism in accordance with the invention includes procedures for determining if an Interval Modulation Code that satisfies the given S, $T_E$, $T_D$, and R constraints exists and includes procedures for constructing optimal Interval Modulation Codes, if such codes exist. The procedure for determining if an Interval Modulation Code might exist has two features. The first novel feature is a procedure for reducing the existence question to a Linear Programming Problem that can be solved using existing algorithms. The second novel feature is an efficient procedure for solving the Linear Programming Problem. The procedure for constructing Interval Modulation Codes in accordance with the invention also has two novel features. The first novel feature is a procedure for reducing the problem of code construction to an Integer Linear Programming Problem that can be solved using existing algorithms. The second novel feature is an efficient procedure for solving the Linear Programming Relaxation of the Integer Linear Program.

Other features and advantages of the present invention should be apparent from the following description, which illustrates, by way of example, the principles of the invention.

DETAILED DESCRIPTION

In this description, a new modulation scheme is proposed. In order to transmit or store data in a rate efficient manner using the proposed modulation scheme, a new type of code is proposed. The new codes provide variable-length-to-variable-length prefix-free codes to map binary data to non-uniform symbol sequences. These codes are referred to as Interval Modulation Codes. Next, it is shown that, given some parameters that describe the performance of the codes, the problem of code construction can be reduced to Integer Linear Programming. It also will be shown that the problem of determining if the Linear Programming Relaxation of the Integer Linear Program has a solution can be reduced to a Linear Programming Problem. This linear programming problem can be solved using commercial linear programming tools that will be known to those skilled in the art. However, an efficient procedure for solving this linear program is also provided with this description. In addition, also provided is an efficient algorithm for solving the Linear Programming Relaxation of the Integer Linear Program, assuming it is feasible. Thus, this invention relates to the modulation scheme, the coding mechanism, and the set of techniques for determining if the code construction problem is feasible, and relates to code construction techniques assuming the code construction problem is feasible. The modulation scheme, the codes, and the set of proposed techniques can be applied to a wide variety of problems in the context of data storage and data transmission.

A. Modulation Scheme, Choice of Symbols, and Rate Enhancement

Figure 1A:
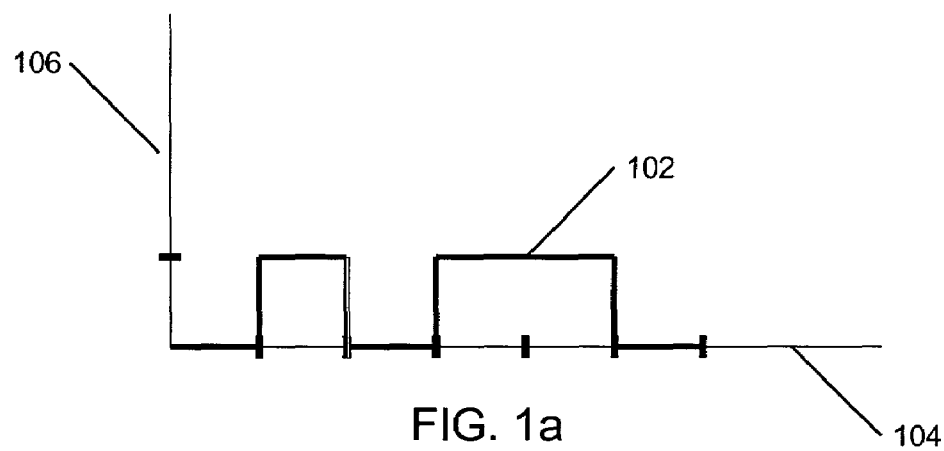
FIG. 1a is a plot of a non-return to zero (NRZ) data signal.
Figure 1B:
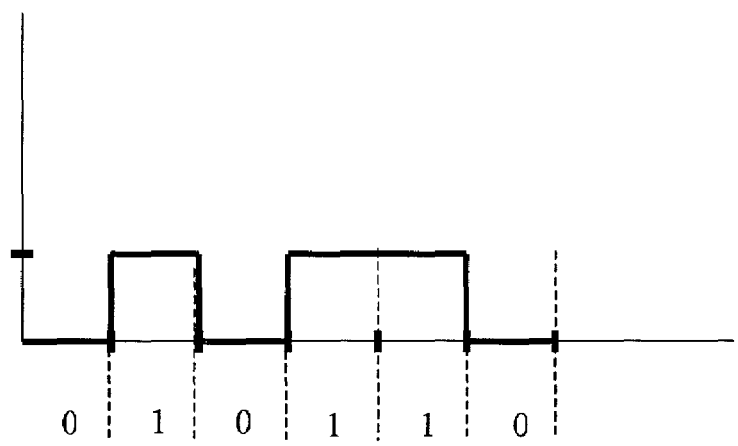
FIG. 1b shows how binary data can be represented using the convention that one state encodes a logical one and the other state encodes a logical zero.
Figure 1C:
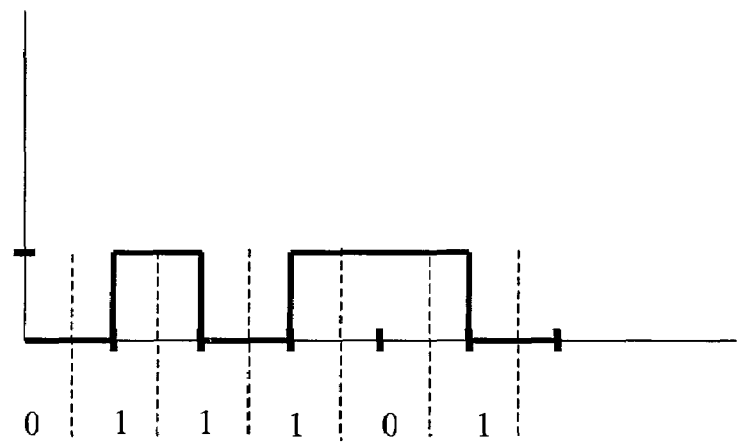
FIG. 1c shows how binary data can be represented using the convention that presence of a transition encodes a logical one and the absence of a transition encodes a logical zero.
Figure 2:
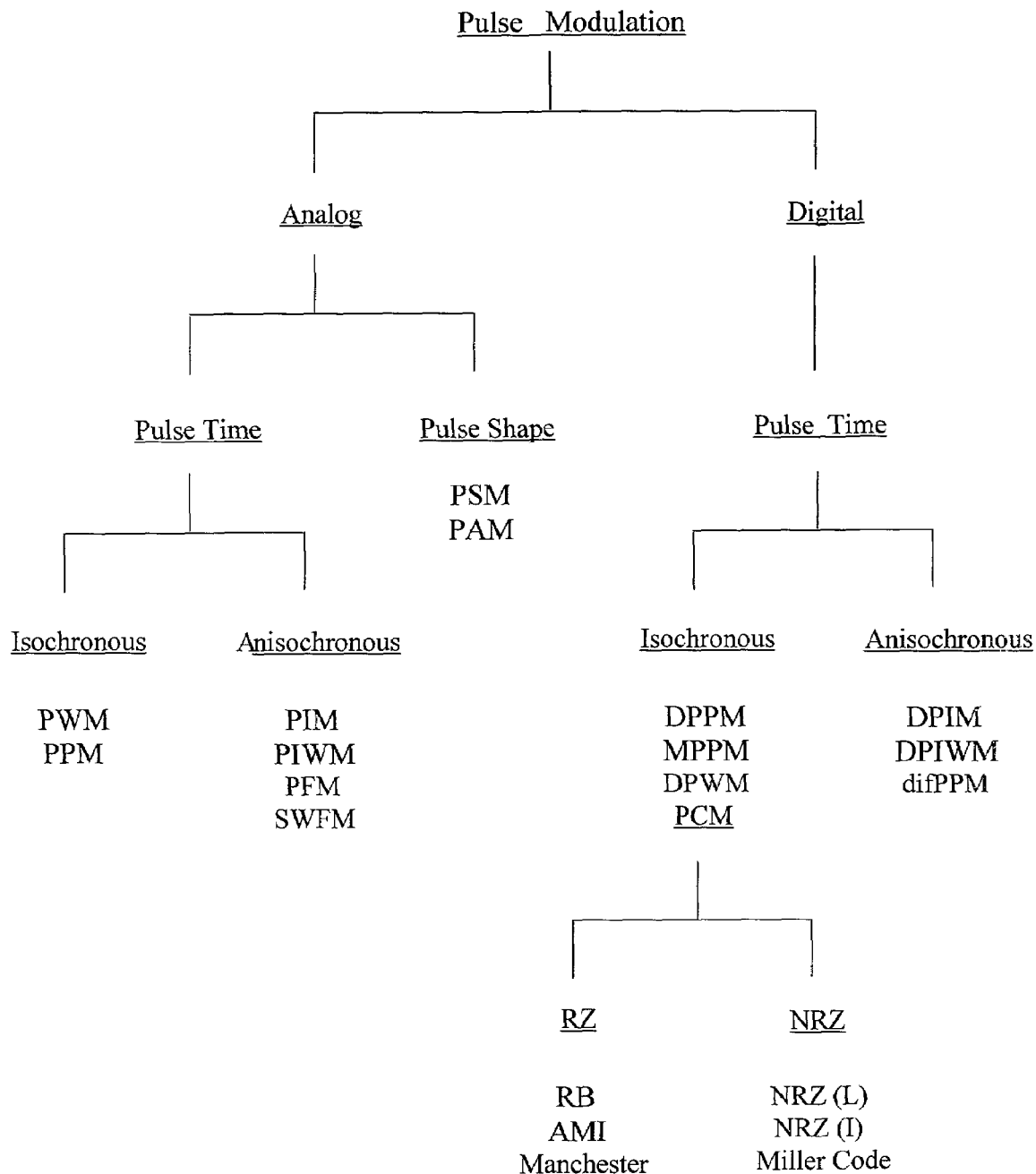
FIG. 2 is a representation of the taxonomy of different modulation schemes.

As noted above, the most commonly used modulation scheme is NRZ. The general taxonomy of different modulation schemes is shown in FIG. 2. The common feature between all these schemes is that the set of permissible time intervals between adjacent data signal transitions is restricted to be an integer multiple of a predetermined constant. In a modulation scheme according to the present invention, the scheme is defined by a set of symbols that represent the permissible time interval between data signal transitions, where the set of symbols is not restricted to comprise consecutive integer multiples of a predetermined constant. Rather, the symbols can be chosen in accordance with a probabilistic model of measurement error, or in accordance with other engineering constraints, and might not comprise consecutive integer multiples of a constant. The idea of choosing symbol durations in accordance with a probabilistic model of measurement error can lead to improvements in terms of storage density or transmission rate. The selection of symbol durations in accordance with the invention will next be illustrated by an example.

First, it is assumed that NRZ modulation is used in conjunction with run length limited codes to transmit data. For this example, it is further assumed that a [0,8] RLL code is used. Hence, the set of permissible time intervals consists of $\{1,2,3,4,5,6,7,8,9\}$. It should be noted that this scheme cannot achieve a data transmission rate of more than 1.0 (bits/unit time). Let $\delta$ be the clock error. It is known that in order to effectively distinguish between an 8 and a 9, Equation (1) below must hold. Solving Equation (1) yields $\delta=5.88\%$.

$$(1+\delta)*8=(1-\delta)*9 \tag{1}$$

Now it is assumed that an analog circuit is used to measure elapsed time. It also is assumed that the smallest measurable time interval is 1 unit and the measurement error is 5.88%. That is to say that measurement error increases with elapsed time at a rate of 5.88%. Let S be the set of symbols. Let $S_{(1)}$ be the symbol with the smallest duration and let $S_{(n)}$ be the symbol with the largest duration. In order for the communication scheme to work reliably Equation (2) below must be satisfied for all i from 1 to n−1.

$$(1+\delta)*S_{(i)}=(1-\delta)*S_{(i+1)} \tag{2}$$

Alternately, if the term $\eta$ is defined as in Equation (3) below, then it is possible to show that the set of symbols should be $\{\eta^0, \eta^1, \eta^2, \eta^3, \eta^4, \ldots, \eta_{n-1}\}$. (It has been assumed that the smallest symbol has duration 1).

$$\eta=(1+\delta)/(1-\delta) \tag{3}$$

Substituting the value of $\delta=5.88\%$ in Equation (3) obtains $$\eta=(1+0.0588)/(1-0.0588) \tag{4}$$

Figure 3:
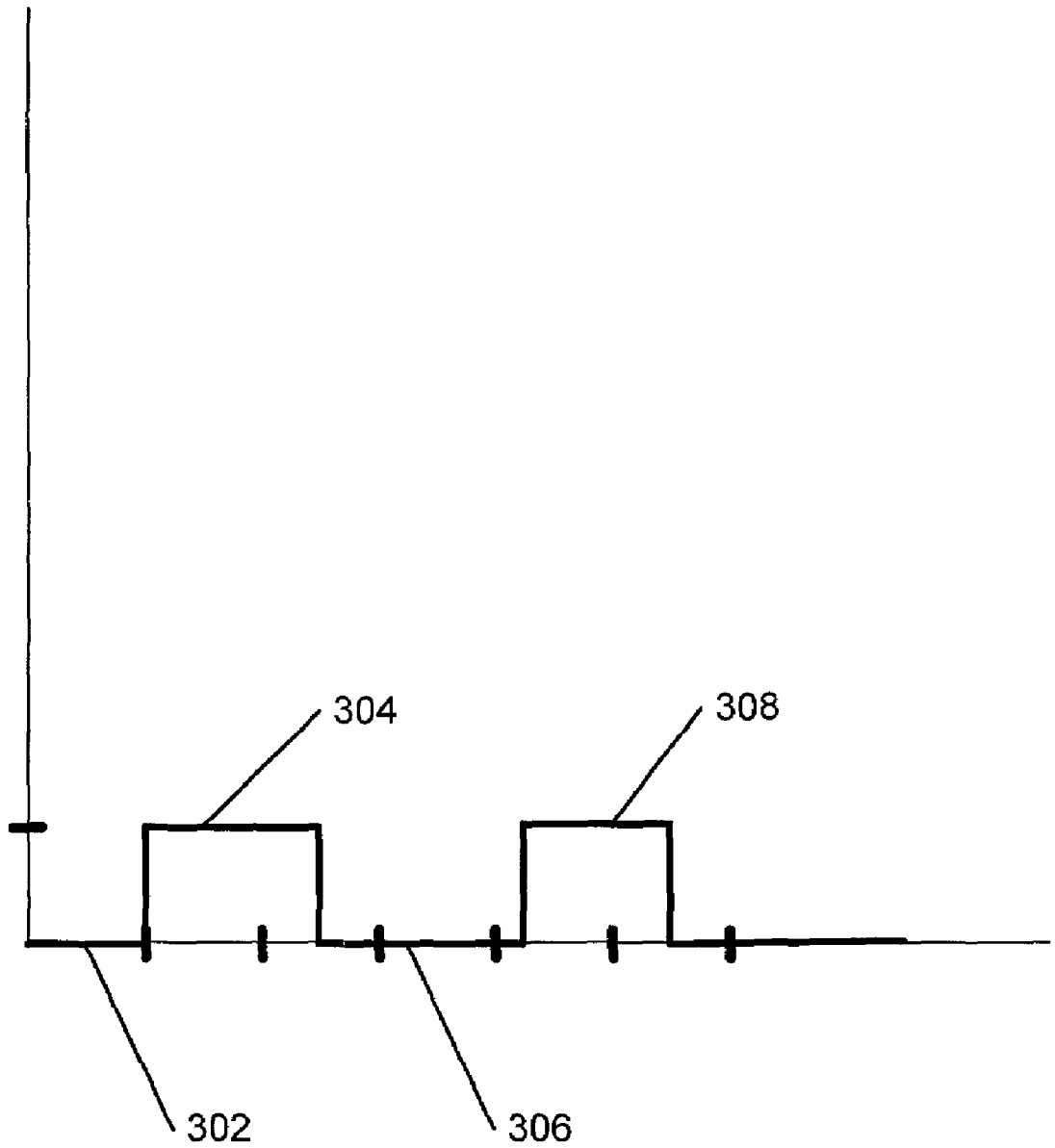
FIG. 3 is a plot of a data signal encoded in accordance with the present invention.

Thus $\eta=1.125$ (approximately). Hence, S=$\{1.00, 1.13, 1.27, 1.42, 1.60, 1.80, 2.03, 2.28, \ldots\}$. FIG. 3 shows a plot of a signal that conforms to a set of symbols selected from the set S determined as above. The signal includes a first interval 302, second interval 304, third interval 306, and fourth interval 308 that are non-uniform, each representing a symbol of the set S. In accordance with the invention, the FIG. 3 signal can be produced from a modulation scheme that has no run length limited constraint.

Figure 4:
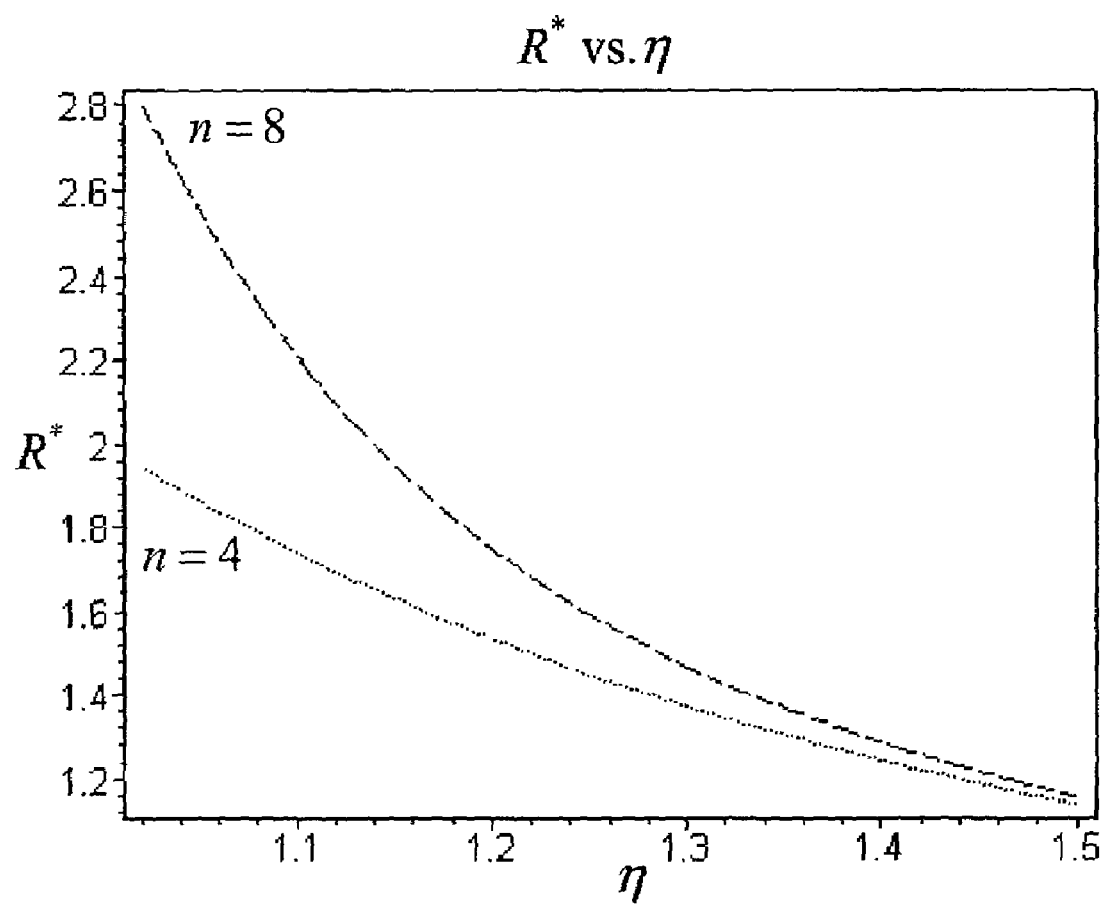
FIG. 4 is a plot of maximum achievable rate R* versus η for a symbol set of size n=4 and n=8.
Figure 5:
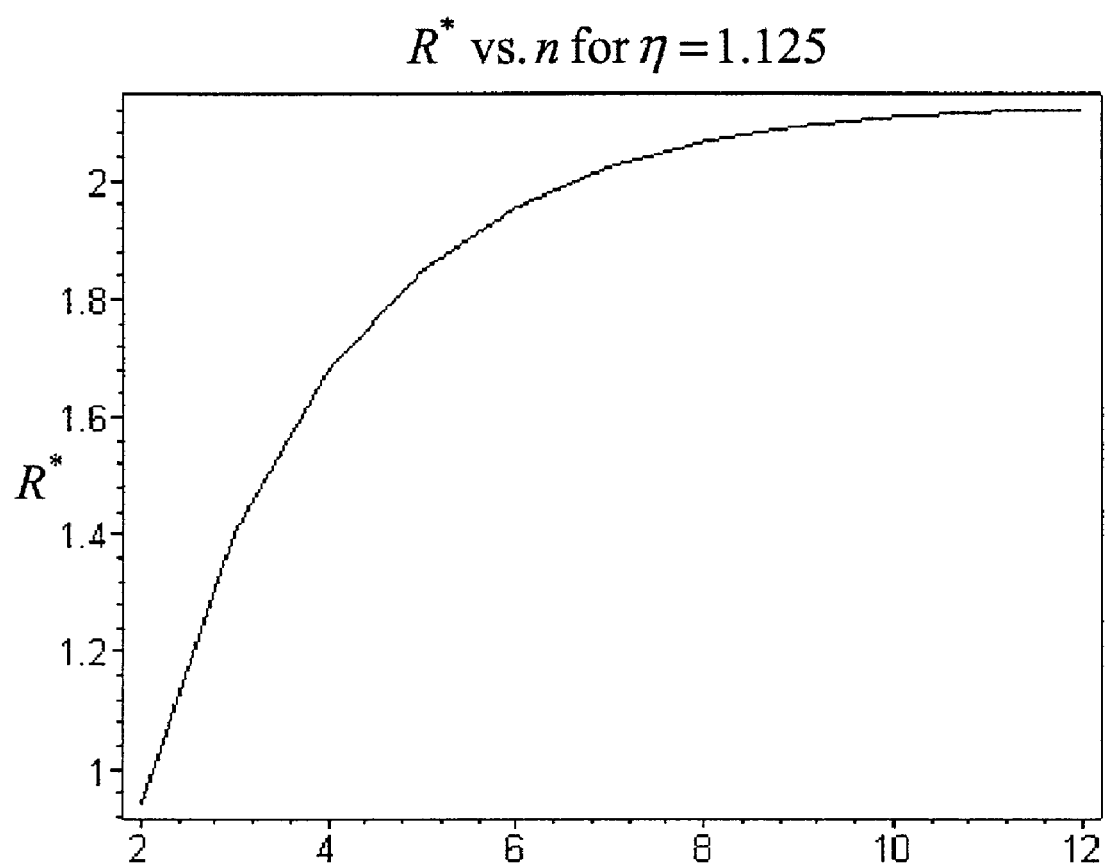
FIG. 5 is a plot of maximum achievable R* versus n, the size of the symbol set, where η=1.125.

FIG. 4 shows a plot of the maximum achievable rate R* as a function of $\eta$ for n=4 and n=8. FIG. 5 shows a plot of the maximum achievable rate R* versus the number of symbols assuming $\eta=1.13$. It should be noted that if the number of symbols is 10, then the maximum achievable rate R* is more than 2. Thus one can realize a two-fold improvement over NRZ modulation and run length limited coding. The above discussion illustrates that if symbols are chosen in accordance with a probabilistic model of measurement error, then one can realize improvements in terms of data rate. In general the model of measurement error may or may not be linear. However, symbols may be chosen in accordance with a probabilistic model of measurement error (regardless of what the model is) and in accordance with other engineering constraints.

The procedure to be used for computing the maximum achievable rate given a set of symbols S will now be described. It will be assumed that the set of symbols consists of integers. If the symbols are not integers then they must be suitably scaled and rounded. The rate can then be computed using the procedure discussed, and the computed rate normalized by the multiplication constant. The term $N_s(T)$ is defined to be the number of sequences constructed using the symbol set S of length T. The maximum achievable rate R* is computed using Equation (5).

$$R^* = \lim_{T \to \infty} \frac{\log_2(\overline{N}_s(T))}{T} \tag{5}$$

B. Interval Modulation Codes

In order to transmit or store data efficiently using the proposed modulation scheme, sophisticated coding techniques are needed. For expository purposes, consider a simple example where the set of permissible time intervals is $\{1, 2\}$. A simple encoding strategy would be to map every binary $\{0\}$ to a $\{1\}$ and to map every binary $\{1\}$ to a $\{2\}$. That code is illustrated in column A of Table 2, below. That code strategy only achieves a worst case rate of 0.5, because a sequence of "T" ones (T $\{1\}$'s) would require 2T time units to be transmitted.

An alternate strategy would be to map 00 to 111, 01 to 12, 10 to 21, 110 to 112, and 111 to 22. This defines an input set of $\{00, 01, 110, 111\}$ and an output set of $\{111, 12, 21, 112, 22\}$. It should be apparent that any input bit sequence can be represented by a sequence of one or more symbols from the input set $\{00, 01, 110, 111\}$. It should be noted that the sets $\{00, 01, 10, 110, 111\}$ and $\{111, 12, 21, 112, 22\}$ are both prefix-free. In the worst case, this scheme would achieve a rate of 0.66, because a sequence of 2T zeroes (2T 0's) would require 3T time units to transmit. Because neither the number of bits nor the number of symbols is fixed, this is a variable-length-to-variable-length prefix-free code. We refer to such mappings from bits to non-uniform symbols as Interval Modulation Codes. That code is tabulated in Table 2, column D, below. A block-to-block prefix-free code is tabulated in Table 2, column A. Two block-to-variable-length prefix-free codes are tabulated in Table 2, columns B and C.

TABLE 2

Sample Modulation Codes

| A<br>R = 0.50 | B<br>R = 0.50 | C<br>R = 0.60 | D<br>R = 0.66 |
|---|---|---|---|
| 0↔1 | 00↔1111 | 000↔11111 | 00↔111 |
| 1↔2 | 01↔112 | 001↔1112 | 01↔12 |
| | 10↔121 | 010↔1121 | 10↔21 |
| | 11↔2 | 011↔1211 | 110↔112 |
| | | 100↔2111 | 111↔22 |
| | | 101↔122 | |
| | | 110↔212 | |
| | | 111↔221 | |

For the code of Column D in Table 2, it should be noted that the maximum number of bits that the encoder might have to examine before it can encode part of the binary sequence is three, corresponding to the symbol 110 or the symbol 111 (three time intervals). This is the delay associated with the encoder and will be referred to as $T_E$. Similarly, the decoder might have to wait up to four units of time before it can map part of the received symbol sequence back to data bits, corresponding to symbol 112 (1+1+2=4 time intervals) or 22 (2+2=4 time intervals). This is the delay associated with the decoder and will be referred to as $T_D$. Furthermore, it should also be noted that the size of the Column D codebook is just five.

Figure 6:
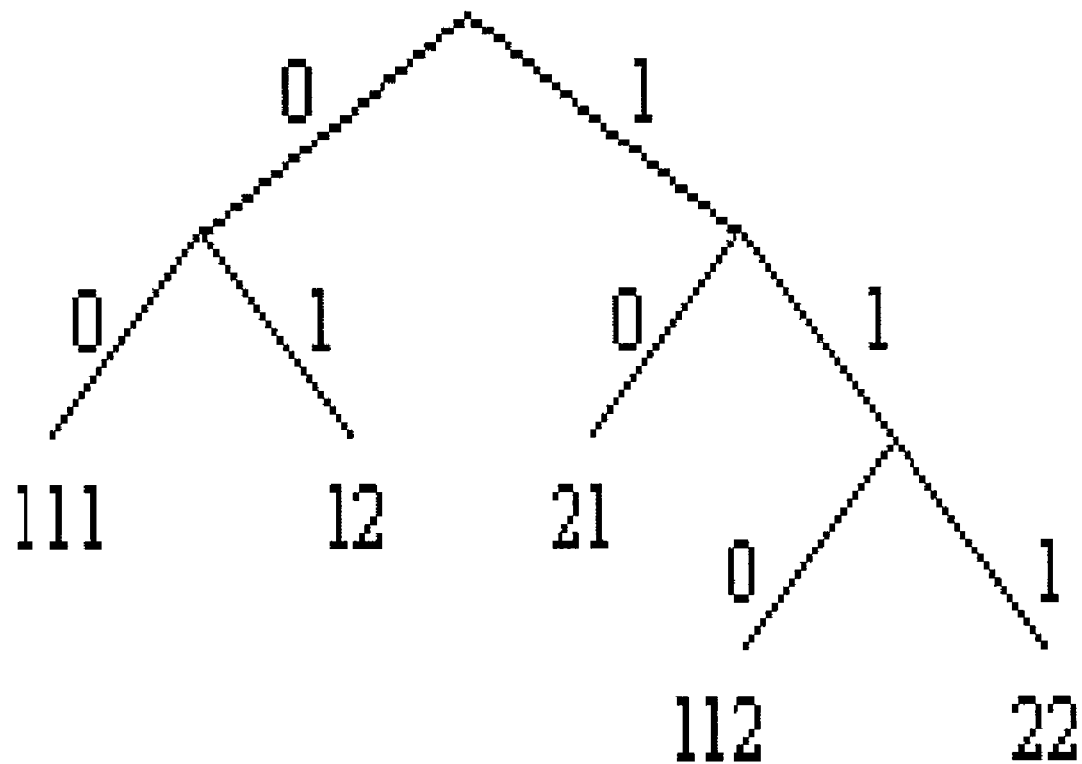
FIG. 6 is an encoding tree diagram that represents the encoding tree for Table 2, Code D, constructed in accordance with the present invention.

Encoding trees are a convenient means of illustrating the operation of the code and showing the encoder delay $T_E$ and decoder delay $T_D$ values described above. FIG. 6 shows an encoding tree that implements the Column D code to receive unconstrained data bits and produce encoded data. The FIG. 6 encoding tree is traversed from top to bottom, in accordance with an input sequence of data bits to be encoded. For example, FIG. 6 shows that a two-bit sequence input of {0, 0} is mapped from the zero branch at the first level of the tree to the next zero branch to the left, at the second level of the tree, to produce an output symbol of {111}, which corresponds to the first code line of Table 2, Column D.

Figure 7:
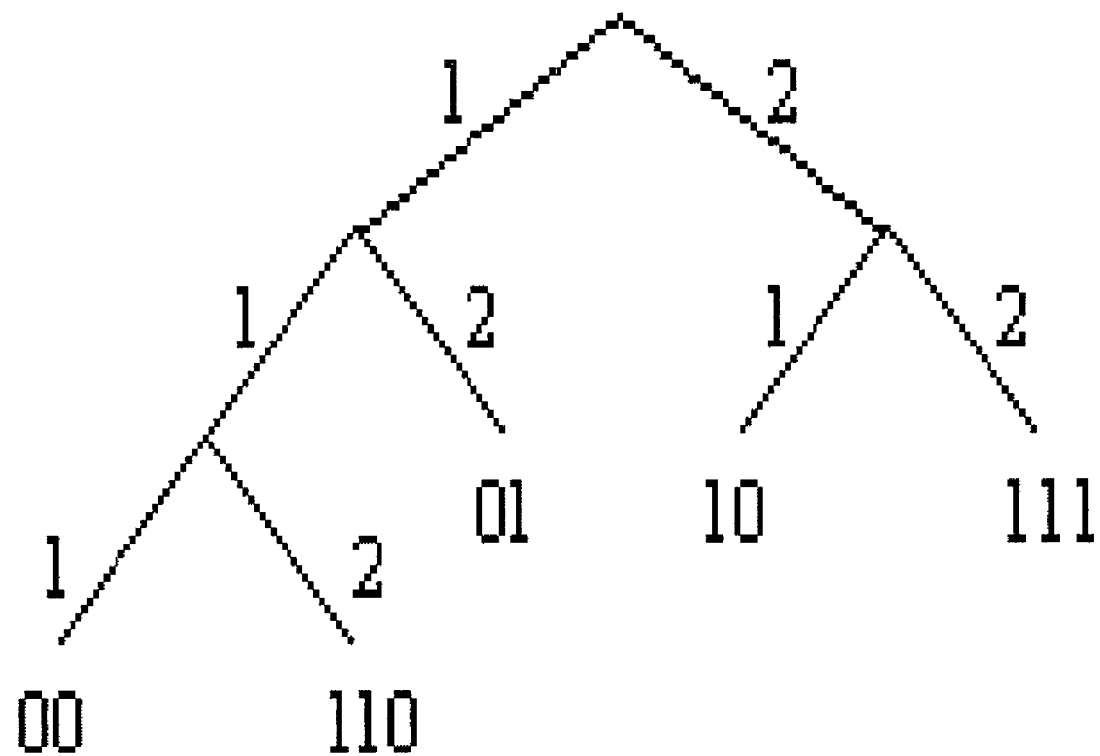
FIG. 7 is a decoding tree diagram that represents the decoding tree for Table 2, Code D, constructed in accordance with the present invention.

FIG. 7 shows a decoding tree that implements the Column D code to receive encoded data and then produce decoded data corresponding to the original data bits. The FIG. 7 decoding tree is traversed from top to bottom, in accordance with a symbol that is to be decoded. For example, FIG. 7 shows that an input symbol of {112} is decoded by moving down the tree from {1} to {1} and then to {2}, generating a decoded input sequence of {1, 1, 0}. Those skilled in the art will be familiar with such encoding and decoding trees.

Most of the prefix-free code construction problems that have been studied thus far are for block-to-variable-length or variable-length-to-block, prefix-free codes. In block-to-variable-length prefix-free codes, the number of source alphabets is fixed but the number of code alphabets is allowed to vary. In variable-length-to-block prefix-free codes, the number of source alphabets is allowed to vary but the number of code alphabets is fixed. For example, Huffman codes are well known and are related to constructing an optimal block-to-variable-length prefix-free code when the probabilities of the source alphabets are different and the transmission costs of the code alphabets are the same. In general, Huffman codes minimize expected transmission time. See, for example, Huffman, A Method for the Construction of Minimum Redundancy Codes, Proceedings of the IRE, Vol. 40, No. 9 at 1098–1101 (1952). Block-to-variable-length prefix-free codes have been the subject of numerous studies, including studies by Varn (Optimal Variable Length Codes, Inf. Control, Vol. 19, No. 4, at 289–301 (1971)), Perl et al. (Efficient Generation of Optimal Prefix Code: Equiprobable Words Using Unequal Cost Letters, J. ACM, Vol. 22, No. 2 at 202–214 (1975)), Cot (Complexity of the Variable Length Encoding Problem, Proc. 6th Southeast Conf. on Combinatorics, Graph Theory and Computing, Congressus Numerantium XIV, Utilitas Mathematica Publishing, Winnepeg, MB, Canada, at 211–244 (1975)), Kapoor et al. (Optimum Lopsided binary Trees, J. ACM, Vol. 36, No. at 573–590 (1989)), and Golin et al. (Prefix Codes: Equiprobable Words, Unequal Letter Costs, SIAM J. Computing, Vol. 25, No. 6 at 1281–1292 (1996)). Variable-length-to-block prefix-free codes were studied by Tunstall in Synthesis of Noiseless Compression Codes, thesis at Georgia Institute of Technology (1967).

In contrast, the present invention is directed to a variable-length-to-variable-length prefix-free code, which is a code in which neither the number of code alphabets nor the number of source alphabets is fixed. In general, fixing the number of code alphabets or the number of source alphabets adversely affects code size. Returning to the example illustrated in Table 2, it should be noted that the code in Column C is larger and does not achieve as high a rate as the variable-length-to-variable-length prefix-free code in Column D. In fact, those skilled in the art will be able to show that the smallest block-to-variable-length prefix-free code (such as the codes of Column B and C) that achieves a rate of 0.66 has 4096 rules. In contrast, the variable-length-to-variable-length, prefix-free code in Column D of Table 2 achieves a rate of 0.66 with only five rules. It should be apparent that a code with fewer rules will be easier to implement and can be operated more efficiently.

More complex Interval Modulation Codes that can be used for communication and storage are shown in Table 3, Table 4, and Table 5. Depending on the choice of symbols, these codes can provide improvements in terms of data transmission rate or data storage density. Other features of the codes are small size, which makes them easy to implement in the form of look up tables, and small symbol sets (having 10 elements). The codes of Table 3, Table 4, and Table 5 below show that one could trade off delays and code size to achieve a better transfer rate.

TABLE 3

Some variable-length-to-variable-length, prefix-free codes constructed in accordance with the invention:
S = {1.00, 1.13, 1.27, 1.42, 1.60, 1.80, 2.03, 2.28, 2.57, 2.89}

| $T_E = 5$ | $T_E = 6$ | $T_E = 7$ |
|---|---|---|
| $T_D = 2.73$ | $T_D = 3.16$ | $T_D = 3.63$ |
| R = 1.83 | R = 1.87 | R = 1.92 |
| 00 ↔ $S_1$ | 00 ↔ $S_1$ | 00 ↔ $S_1$ |
| 010 ↔ $S_3$ | 010 ↔ $S_3$ | 010 ↔ $S_4$ |
| 011 ↔ $S_4$ | 011 ↔ $S_4$ | 0110 ↔ $S_6$ |
| 100 ↔ $S_5$ | 100 ↔ $S_5$ | 0111 ↔ $S_7$ |
| 1010 ↔ $S_6$ | 1010 ↔ $S_6$ | 10000 ↔ $S_2S_1$ |
| 1011 ↔ $S_7$ | 1011 ↔ $S_7$ | 10001 ↔ $S_2S_2$ |
| 1100 ↔ $S_2S_1$ | 1100 ↔ $S_2S_1$ | 10010 ↔ $S_2S_1$ |
| 11010 ↔ $S_2S_2$ | 11010 ↔ $S_2S_2$ | 10011 ↔ $S_8$ |
| 11011 ↔ $S_8$ | 11011 ↔ $S_8$ | 10100 ↔ $S_2S_3$ |
| 11100 ↔ $S_2S_3$ | 11100 ↔ $S_2S_3$ | 10101 ↔ $S_3S_2$ |
| 11101 ↔ $S_2S_4$ | 11101 ↔ $S_2S_4$ | 10110 ↔ $S_3S_3$ |
| 11110 ↔ $S_9$ | 11110 ↔ $S_9$ | 10111 ↔ $S_2S_4$ |
| 11111 ↔ $S_2S_5$ | 111110 ↔ $S_2S_5$ | 11000 ↔ $S_9$ |
|  | 111111 ↔ $S_2S_7$ | 11001 ↔ $S_5S_1$ |
|  |  | 110100 ↔ $S_3S_4$ |
|  |  | 110101 ↔ $S_2S_5$ |
|  |  | 110110 ↔ $S_5S_2$ |
|  |  | 110111 ↔ $S_3S_5$ |
|  |  | 111000 ↔ $S_5S_3$ |
|  |  | 111001 ↔ $S_{10}$ |
|  |  | 111010 ↔ $S_2S_6$ |
|  |  | 111011 ↔ $S_5S_4$ |
|  |  | 111100 ↔ $S_3S_6$ |
|  |  | 1111010 ↔ $S_2S_7$ |
|  |  | 1111011 ↔ $S_5S_5$ |
|  |  | 1111100 ↔ $S_3S_7$ |
|  |  | 1111101 ↔ $S_5S_6$ |
|  |  | 1111110 ↔ $S_3S_8$ |
|  |  | 1111111 ↔ $S_5S_7$ |

TABLE 4

Code alternatives to [1, 7] Code, constructed in accordance with the invention:
S = {2.00, 2.29, 2.61, 2.99, 3.41, 3.90, 4.46, 5.09, 5.82, 6.65}

| $T_E = 4$ | $T_E = 6$ | $T_E = 7$ |
|---|---|---|
| $T_D = 4.46$ | $T_D = 6.75$ | $T_D = 7.70$ |
| R = 0.87 | R = 0.89 | R = 0.91 |
| 00 ↔ $S_1$ | 00 ↔ $S_1$ | 000 ↔ $S_4$ |
| 01 ↔ $S_2$ | 010 ↔ $S_4$ | 0010 ↔ $S_6$ |

TABLE 4-continued

Code alternatives to [1, 7] Code, constructed
in accordance with the invention:
S = {2.00, 2.29, 2.61, 2.99, 3.41, 3.90, 4.46, 5.09, 5.82, 6.65}

| $T_E = 4$ | $T_E = 6$ | $T_E = 7$ |
|---|---|---|
| $T_D = 4.46$ | $T_D = 6.75$ | $T_D = 7.70$ |
| R = 0.87 | R = 0.89 | R = 0.91 |
| 100 ↔ $S_3$ | 0110 ↔ $S_6$ | 0011 ↔ $S_1S_1$ |
| 101 ↔ $S_4$ | 0111 ↔ $S_2S_1$ | 0100 ↔ $S_1S_2$ |
| 110 ↔ $S_5$ | 1000 ↔ $S_7$ | 0101 ↔ $S_2S_1$ |
| 1110 ↔ $S_6$ | 10010 ↔ $S_2S_2$ | 01100 ↔ $S_1S_3$ |
| 1111 ↔ $S_7$ | 10011 ↔ $S_3S_1$ | 01101 ↔ $S_3S_1$ |
|  | 10100 ↔ $S_2S_3$ | 01110 ↔ $S_2S_3$ |
|  | 10101 ↔ $S_3S_2$ | 01111 ↔ $S_3S_2$ |
|  | 10110 ↔ $S_8$ | 10000 ↔ $S_1S_4$ |
|  | 10111 ↔ $S_3S_3$ | 10001 ↔ $S_8$ |
|  | 11000 ↔ $S_2S_4$ | 10010 ↔ $S_3S_3$ |
|  | 11001 ↔ $S_5S_1$ | 10011 ↔ $S_2S_4$ |
|  | 11010 ↔ $S_3S_4$ | 10100 ↔ $S_1S_5$ |
|  | 110110 ↔ $S_2S_5$ | 10101 ↔ $S_5S_1$ |
|  | 110111 ↔ $S_5S_2$ | 101100 ↔ $S_3S_4$ |
|  | 111000 ↔ $S_9$ | 101101 ↔ $S_2S_5$ |
|  | 111001 ↔ $S_3S_5$ | 101110 ↔ $S_5S_2$ |
|  | 111010 ↔ $S_5S_3$ | 101111 ↔ $S_9$ |
|  | 111011 ↔ $S_2S_6$ | 110000 ↔ $S_1S_6$ |
|  | 111100 ↔ $S_5S_4$ | 110001 ↔ $S_3S_5$ |
|  | 111101 ↔ $S_3S_6$ | 110010 ↔ $S_5S_3$ |
|  | 111110 ↔ $S_{10}$ | 110011 ↔ $S_2S_6$ |
|  | 111111 ↔ $S_2S_7$ | 110100 ↔ $S_5S_4$ |
|  |  | 110101 ↔ $S_1S_7$ |
|  |  | 110110 ↔ $S_7S_1$ |
|  |  | 110111 ↔ $S_3S_6$ |
|  |  | 111000 ↔ $S_2S_2S_1$ |
|  |  | 1110010 ↔ $S_{10}$ |
|  |  | 1110011 ↔ $S_2S_7$ |
|  |  | 1110100 ↔ $S_7S_2$ |
|  |  | 1110101 ↔ $S_5S_5$ |
|  |  | 1110110 ↔ $S_2S_2S_2$ |
|  |  | 1110111 ↔ $S_3S_7$ |
|  |  | 1111000 ↔ $S_7S_3$ |
|  |  | 1111001 ↔ $S_1S_8$ |
|  |  | 1111010 ↔ $S_2S_2S_3$ |
|  |  | 1111011 ↔ $S_5S_6$ |
|  |  | 1111100 ↔ $S_2S_8$ |
|  |  | 1111101 ↔ $S_7S_4$ |
|  |  | 1111110 ↔ $S_2S_2S_4$ |
|  |  | 1111111 ↔ $S_3S_8$ |

TABLE 5

Alternatives to conventional [2, 7] code,
constructed in accordance with the invention:
S = {3.00, 3.43, 3.92, 4.48, 5.12, 5.85, 6.68, 7.64, 8.73, 9.98}

| $T_E = 4$ | $T_E = 6$ | $T_E = 8$ |
|---|---|---|
| $T_D = 6.68$ | $T_D = 10.11$ | $T_D = 12.76$ |
| R = 0.58 | R = 0.59 | R = 0.61 |
| 00 ↔ $S_1$ | 00 ↔ $S_1$ | 00 ↔ $S_1$ |
| 01 ↔ $S_2$ | 010 ↔ $S_4$ | 010 ↔ $S_4$ |
| 100 ↔ $S_3$ | 0110 ↔ $S_6$ | 0110 ↔ $S_6$ |
| 101 ↔ $S_4$ | 0111 ↔ $S_2S_1$ | 0111 ↔ $S_2S_1$ |
| 110 ↔ $S_5$ | 1000 ↔ $S_7$ | 10000 ↔ $S_2S_2$ |
| 1110 ↔ $S_6$ | 10010 ↔ $S_2S_2$ | 10001 ↔ $S_3S_1$ |
| 1111 ↔ $S_7$ | 10011 ↔ $S_3S_1$ | 10010 ↔ $S_2S_3$ |
|  | 10100 ↔ $S_2S_3$ | 10011 ↔ $S_3S_2$ |
|  | 10101 ↔ $S_3S_2$ | 10100 ↔ $S_8$ |
|  | 10110 ↔ $S_8$ | 10101 ↔ $S_3S_3$ |
|  | 10111 ↔ $S_3S_3$ | 10110 ↔ $S_2S_4$ |
|  | 11000 ↔ $S_2S_4$ | 10111 ↔ $S_5S_1$ |
|  | 11001 ↔ $S_5S_1$ | 110000 ↔ $S_3S_4$ |
|  | 11010 ↔ $S_3S_4$ | 110001 ↔ $S_2S_5$ |
|  | 110110 ↔ $S_2S_5$ | 110010 ↔ $S_5S_2$ |
|  | 110111 ↔ $S_5S_2$ | 110011 ↔ $S_9$ |
|  | 111000 ↔ $S_9$ | 110100 ↔ $S_3S_5$ |

TABLE 5-continued

Alternatives to conventional [2, 7] code,
constructed in accordance with the invention:
S = {3.00, 3.43, 3.92, 4.48, 5.12, 5.85, 6.68, 7.64, 8.73, 9.98}

| $T_E = 4$ | $T_E = 6$ | $T_E = 8$ |
|---|---|---|
| $T_D = 6.68$ | $T_D = 10.11$ | $T_D = 12.76$ |
| R = 0.58 | R = 0.59 | R = 0.61 |
|  | 111001 ↔ $S_3S_5$ | 110101 ↔ $S_5S_3$ |
|  | 111010 ↔ $S_5S_3$ | 110110 ↔ $S_2S_6$ |
|  | 111011 ↔ $S_2S_6$ | 110111 ↔ $S_5S_4$ |
|  | 111100 ↔ $S_5S_4$ | 111000 ↔ $S_7S_1$ |
|  | 111101 ↔ $S_3S_6$ | 111001 ↔ $S_3S_6$ |
|  | 111110 ↔ $S_{10}$ | 1110100 ↔ $S_{10}$ |
|  | 111111 ↔ $S_2S_7$ | 1110101 ↔ $S_2S_7$ |
|  |  | 1110110 ↔ $S_7S_2$ |
|  |  | 1110111 ↔ $S_5S_5$ |
|  |  | 1111000 ↔ $S_3S_7$ |
|  |  | 1111001 ↔ $S_7S_3$ |
|  |  | 1111010 ↔ $S_5S_6$ |
|  |  | 1111011 ↔ $S_2S_8$ |
|  |  | 1111100 ↔ $S_7S_4$ |
|  |  | 11111010 ↔ $S_3S_8$ |
|  |  | 11111011 ↔ $S_5S_7$ |
|  |  | 11111100 ↔ $S_7S_5$ |
|  |  | 11111101 ↔ $S_2S_9$ |
|  |  | 11111110 ↔ $S_3S_9$ |
|  |  | 11111111 ↔ $S_5S_8$ |

C. Constructing Interval Modulation Codes Using Integer Linear Programming

The non-uniform interval modulation codes described above provide advantages in terms of transmission rate and storage density. The usefulness of this novel development is supplemented by a novel technique for producing an optimal interval modulation code, given a set of parameters that describes the performance of the code.

C.1. Code Parameters

An interval modulation code in accordance with the present invention can be constructed by first specifying a desired symbol set of non-uniform intervals S, a permitted encoder delay time $T_E$, a permitted decoder delay time $T_D$, and a desired transfer rate R. The symbol set S can be specified in accordance with the description above for determining non-uniform intervals (see Section A above, "Modulation Scheme, Choice of Symbols, and Rate Enhancement").

C.2. Code Construction Using Integer Linear Programming

After the code parameters have been set, another aspect of the present invention is the specification of the optimal code construction problem as an integer linear programming problem. Formulating the integer linear programming problem for code identification in accordance with the present invention involves determining the proper objective function and set of constraints for the problem statement in view of the $T_E$, $T_D$, and R parameters. That is, given the parameters $T_E$, $T_D$, and R, and a set of integer symbols S, the problem is to determine a tree T with the fewest possible leaves such that the maximum encoder delay is $T_E$, the maximum decoder delay is $T_D$, and the rate is at least R, such that the labels of the leaves of the tree form a prefix-free set over S.

Various examples of symbol sets S of non-uniform intervals were described above, along with the relationship between symbol elements, in accordance with Equations (2) and (3). For purposes of this integer linear programming problem statement, the non-integer nature of the symbol sets will be ignored until later. The encoder delay time $T_E$ for a code was described above. The maximum permitted encoder delay time $\max(T_E)$ can be described mathematically as $\max_x d_e(x)$, where $d_e(x)$ denotes the length of the path from the root of an encoding tree such as FIG. 6 to a symbol output x. The maximum decoder delay for a code can be described mathematically as $\max_x d_d(x)$, where $d_d(x)$ denotes the length of the path from the root of an decoding tree such as FIG. 7 to a data output x. In accordance with the present invention, the data transfer rate R of the code S will be defined according to Equation (6):

$$R = \min_x [d_e(x)/d_d(x)] \qquad (6)$$

The objective function and the set of integer linear programming constraints will be specified in terms of a notation in which $x_d^l$ represents the number of leafs (a non-negative integer) in the encoder tree at depth d that have a label of length l. We define $x^l$ to be the number of labels of length l and $x_d$ to be the number of leafs in the encoder at depth d. That is, these terms are defined by the set of relationships given by Equation (7):

$$x^l = \sum_{i=1}^{T_E} x_i^l \text{ and } x_d = \sum_{i=l}^{T_D} x_d^i \qquad (7)$$

The subject of the integer linear programming problem is to design the smallest encoder/decoder pair given these constraints, specified by Equation (8), as follows:

$$\min \sum_{i=l}^{T_D} \sum_{j=1}^{T_E} x_j^i \qquad (8)$$

The Equation (8) integer linear programming problem must be solved subject to the following constraints:

$$\sum_{i=1}^{T_E} 2^{(T_E - i)} x_i = 2^{T_E} \qquad (9)$$

$$\text{For } 1 \leq L \leq T_D, \; x^L + \sum_{l=1}^{L-1} N_k(L-l) x^l \leq N_K(L) \qquad (10)$$

$$j/i < R \Rightarrow x_j^i = 0, x_j^i \geq 0 \qquad (11)$$

Equation (9) follows from the Kraft Inequality for full binary trees, which applies because the encoder tree is a full prefix tree, and indicates that a full binary tree can be constructed such that the number of leafs at depth i is $x_i$. Equation (10) follows from the fact that the labels attached to the leaf nodes of the encoder tree must form a prefix-free set over the symbol set S. This means that a prefix-free set Ms over symbol set S can be specified such that the number of labels in Ms of length l is $x^l$.

In Equation (10), the $K_i$ terms refer to a value of $\{1\}$ if the index i is an element of the symbol set and $\{0\}$ if the index is not an element of the set S, for the index i varying as $i = \{1, 2, 3, \ldots, m-1, m\}$ for an integer m the largest integer in the symbol set S. This is represented in Equation (12):

$$K_i = \{1, \text{ if } i \in S, 0 \text{ if } i \notin S \qquad (12)$$

The elements $N_K(T)$ are defined as follows in Equation (13):

$$N_K(T) = \begin{cases} \sum_{i=1}^{m} K_i N_K(T-i) & T > m \\ K_1 + \sum_{i=1}^{T-1} K_i N_K(T-i) & 2 \leq T \leq m \\ K_1 & T = 1 \end{cases} \qquad (13)$$

It should be appreciated that $N_K$ is a generalization of the Fibonacci Numbers, such that if S is the set $S = \{1, 2, \ldots, m-1, m\}$, then $N_K(T)$ is the $(T+1)$th Fibonacci Number of order m.

Finally, the encoder and decoder must achieve the desired transfer rate R, thus, Equation (11) specifies that all leafs must have a ratio of the encoder index j over the decoder index i larger than or equal to R. Therefore, $x_j^i$ labels of length i from the set $M_S$ can be arbitrarily assigned to leaf nodes of the encoder tree at depth j. The integer linear programming problem statement above can be represented in a matrix notation. Let $I^n$ be the n×n identity matrix. In Equation (14) we define an n×n matrix $A^n$. This definition is motivated by Equation (10).

$$A^n = \begin{bmatrix} 1 & N_K(1) & \ldots & N_K(n-2) & N_K(n-1) \\ 0 & 1 & \ldots & N_K(n-3) & N_K(n-2) \\ \vdots & \vdots & \ldots & \vdots & \vdots \\ 0 & 0 & \ldots & 1 & N_K(1) \\ 0 & 0 & \ldots & 0 & 1 \end{bmatrix} \qquad (14)$$

Let the $K_j$ terms be defined as in Equation (12). Let the ith column of $A^n$ be represented by $A^n_i$ and let the ith column of $I^n$ be represented by $1^n_i$. The matrix $A^n$ can be specified recursively as follows in Equation (15):

$$A_i^n = \begin{cases} I_i^n + \sum_{j=1}^{m} K_j A_{i-j}^n & i > m \\ I_i^n + \sum_{j=1}^{i-1} K_j A_{i-j}^n & 2 \leq i \leq m \\ I_1^n & i = 1 \end{cases} \qquad (15)$$

For this description of the integer linear programming problem, given $K \in \{0, 1\}^m$ and $\alpha \in \{0, R^+\}^n$, let $\Gamma(K, \alpha) = \{y | y \in \{0, R^+\}^n, \text{and } A^n y \leq A^n \alpha\}$. The term $\Gamma(K, \alpha)$ will be referred to as a Generalized Fibonacci Polyhedra of dimension n and order m. The integer linear programming problem above, specified by the Equations (8) through (13), can be restated as minimizing the value cx subject to the condition that $px = k$ and $A^n x \leq A^n \alpha$, $x \in \{0, R+\}^n$ where c is a vector of cost coefficients such as given in Equation (8), and where p is a vector and k is a scalar that define the hyperplane given in Equation (9).

C.3 Example I

An example will help illustrate the technique in accordance with the present invention. The example begins with a given set of code parameters, where the symbol set S comprises $S = \{1, 2, 3\}$, $T_E = 5$, $T_D = 6$, and $R = 4/5 = 0.80$. The integer linear programming problem specification is given by Equations (8), (9), (10), and (11) above.

It should be noted that, without loss of generality, it can be assumed that the only non-zero variables are x11, x22, x33, x44, x54, and x65 (in a simplification of notation, the term [$x_b^a$] will also be written as [xab]). To show that this generality assumption is reasonable, consider an example, that it is claimed x23=0. Then if it is assumed that x23>0, then x22 is increased by (x23)/2 and x23 is set such that x23=0. Then from the definitions of the $x^n$ terms, the value of $x^2$ decreased as a result of these changes, and thus the decoder inequalities are still satisfied. However, $x_3$ decreased by (x23) and $x_2$ increased by (x23)/2. Since the coefficient associated with $x_3$ is 4 and the coefficient associated with $x_2$ is 8, the encoder equality will still be satisfied. Also the value of the cost function has decreased. Thus, in an optimal solution, x23=0. The integer linear program above can be reduced to the integer linear program problem given by: minimize cx subject to px=k, $A^n X \leq A^n \alpha$, $x \in \{0, 1^+\}^n$, where c=[1, 1, 1, 1, 1, 1], x=[$x_5^6$, $x_4^5$, $x_4^4$, $x_3^3$, $x_2^2$, $x^{11}$]$^T$ (in an alternative notation, x will be written as x=[x65, x54, x44, x33, x22, x11]$^T$), p={1, 2, 2, 4, 8, 16}, k=32, and $\alpha$={0, 0, 0, 1, 1, 1} and the matrix $A^n$ is given by Equation (16):

$$A^n = \begin{bmatrix} 1 & 1 & 2 & 4 & 7 & 13 \\ 0 & 1 & 1 & 2 & 4 & 7 \\ 0 & 0 & 1 & 1 & 2 & 4 \\ 0 & 0 & 0 & 1 & 1 & 2 \\ 0 & 0 & 0 & 0 & 1 & 1 \\ 0 & 0 & 0 & 0 & 0 & 1 \end{bmatrix} \quad (16)$$

The integer linear programming associated with this code construction problem, given the code parameters, can be solved using standard, conventional integer linear programming (ILP) problem solvers. Such ILP tools will be familiar to those skilled in the art. Using such ILP tools, it can be found that the solution to this ILP is given by x11=1, x54=6, and x65=4. All other variables are zero (0). Hence, the size of the code will be 11 (1+6+4).

To construct the code itself, a prefix-free set is constructed using the source alphabet {0, 1} such that the number of elements consisting of one bit is one, the number of elements consisting of four bits is six, and the number of elements consisting of five bits is four. This follows from the fact that the ILP solution set gives x11=1, x54=6, and x65=4, with all other variables zero. For example, a valid prefix free set A is given by A={0, 1000, 1001, 1010, 1011, 1100, 1101, 11100, 11101, 11110, 11111}.

Next, a prefix-free symbol set is constructed from the alphabet {1, 2, 3} such that the number of elements having a duration of one unit is one, the number of elements having a duration of five units is six, and the number of elements having a duration of six units is four. This follows from the fact that the ILP solution set gives x11=1, x54=6, and x65=4, with all other variables zero. For example, a valid prefix-free set B given by B={1, 2111, 212, 221, 23, 311, 32, 2112, 213, 312, 33}. This forms an output (encoded) symbol set.

Next, an arbitrary mapping is defined, mapping one element of one bit from the set A to one element of duration one in set B. Then, an arbitrary mapping is defined, mapping the six elements of four bits, from set A, to the six elements of duration five in set B, in a one-to-one manner. Finally, an arbitrary mapping is defined from the four elements of five bits in set A to the four elements of six units duration in set B, in a one-to-one manner. The valid mapping (and the resultant modulation code) is shown in Table 6 below:

TABLE 6

Sample Modulation Code

| |
|---|
| 0 ↔ 1 |
| 1000 ↔ 2111 |
| 1001 ↔ 212 |
| 1010 ↔ 221 |
| 1011 ↔ 23 |
| 1100 ↔ 311 |
| 1101 ↔ 32 |
| 11100 ↔ 2112 |
| 11101 ↔ 213 |
| 11110 ↔ 312 |
| 11111 ↔ 33 |

Thus, stating the code definition problem in terms of desired code parameters and then characterizing the problem as an integer linear programming problem in the matrix notation described above permits a solution to be found using conventional ILP techniques and problem solvers to define the size and composition of a modulation code. The source symbols and code symbols can then be arbitrarily mapped to each other, producing a suitable interval modulation code in accordance with the teachings of the present invention.

D. Determining the Existence of Interval Modulation Codes Using Linear Programming Returning to the description of the integer linear programming problem from above, the objective function is given by Equation (8) reproduced here:

$$\min \sum_{i=1}^{T_D} \sum_{j=1}^{T_E} x_j^i \quad (8)$$

And the constraints are given by Equation (9), Equation (10) and Equation (11) reproduced here:

$$\sum_{i=1}^{T_E} 2^{(T_E-i)} x_i = 2^{T_E} \quad (9)$$

$$\text{For } 1 \leq L \leq T_D, \; x^L + \sum_{l=1}^{L-1} N_k(L-l)x^l \leq N_K(L) \quad (10)$$

$$j/i < R \Rightarrow x_j^i = 0, x_j^i \geq 0 \quad (11)$$

For a solution to exist, the hyperplane defined by Equation (9) must intersect the convex polyhedra defined by Equation (10) and Equation (11). It is noted that this criteria is both necessary and sufficient for the linear programming relaxation of the integer linear programming problem to have a solution. However, it is not sufficient, only necessary, to ensure that the integer linear programming problem has a solution. The hyperplane intersects the polyhedra if and only if the maximum of the Equation (9) summation term subject to Equations (10) and (11) is greater than or equal to $2^{T_E}$.

D.1 Example I

An example will help illustrate this technique in accordance with the present invention. The example begins with a given set of code parameters, where the symbol set S comprises S={1, 2, 3}, $T_E$=7, $T_D$=8, and R=6/7=0.857. It is desired to determine if the linear programming relaxation of the integer linear program problem has a solution. As described previously, the integer linear programming problem specification is given by Equations (8), (9), (10), and (11) above.

It can be assumed that the only non-zero variables are x11, x22, x33, x44, x55, x66, x76, and x87. To show that this is a reasonable assumption, first consider as an example, that it is claimed x23=0. Then if it is assumed that x23>0, increase x22 by (x23)/2 and set x23=0. Those skilled in the art will appreciate that, from the definitions of the x″ terms, the value of $x^2$ decreased, and thus the decoder inequalities are still satisfied. However, $X_3$ decreased by (x23) and $x_2$ increased by (x23)/2. Since the coefficient associated with $x_3$ is 16 and the coefficient associated with $x_2$ is 32, the encoder equality will still be satisfied. Also the value of the cost function has decreased. Thus, in an optimal solution, x23=0.

The integer linear program above can be relaxed to the linear program problem given by: minimize cx subject to px=k, $A''X \leq A''\alpha$, $x\epsilon\{0, R^+\}^n$, where c=[1, 1, 1, 1, 1, 1, 1, 1], x=[x87, x76, x66, x55, x44, x33, x22, x11]$^T$ and p=[1, 2, 2, 4, 8, 16, 32, 64], k=128, α=[0, 0, 0, 0, 0, 1, 1, 1], and the matrix $A''$ given by Equation (17) below:

$$A'' = \begin{bmatrix} 1 & 1 & 2 & 4 & 7 & 13 & 24 & 44 \\ 0 & 1 & 1 & 2 & 4 & 7 & 13 & 24 \\ 0 & 0 & 1 & 1 & 2 & 4 & 7 & 13 \\ 0 & 0 & 0 & 11 & 1 & 2 & 4 & 7 \\ 0 & 0 & 0 & 0 & 1 & 1 & 2 & 4 \\ 0 & 0 & 0 & 0 & 0 & 1 & 1 & 1 \\ 0 & 0 & 0 & 0 & 0 & 0 & 1 & 1 \\ 0 & 0 & 0 & 0 & 0 & 0 & 0 & 1 \end{bmatrix} \quad (17)$$

Those skilled in the art will appreciate that a sufficient and necessary condition for the linear programming relaxation of the integer linear programming problem to have a solution is that the maximum attained by the linear program statement below must be greater than or equal to k=128, as specified by Equation (18) below:

$$\text{maximize px subject to } A''X \leq A''\alpha, x\epsilon\{0, R^{30}\}^n \quad (18)$$

Those skilled in the art will appreciate that a solution to the LP problem given by Equation (18) can be found using conventional linear programming techniques. Using linear programming techniques, it can be shown that the maximum attained by the linear program solution for this example is just 125, which falls short of the required k=128 for a solution. Therefore, the linear programming relaxation of the integer linear program problem has no solution. This means that no suitable interval modulation code can be defined for this set of code parameters.

D.2 Example II

Another example will help illustrate the technique in accordance with the present invention. The example utilizes the set of code parameters given for Section C.3 above, where the symbol set S comprises S={1, 2, 3}, $T_E$=5, $T_D$=6, and R=⅘=0.80.

As before, it can be assumed that the only non zero variables are x11, x22, x33, x44, x54, and x65. The integer linear program can be relaxed to the linear program problem given by: minimize cx subject to px=k, $A''X \leq A''\alpha$, $x\epsilon\{0, R^+\}^n$, where c=[1, 1, 1, 1, 1, 1], x=[$x_5^6, x_4^5, x_4^4, x_3^3, x_2^3, x_1^1$]$^T$ (alternatively, x will be written as x=[x65, x54, x44, x33, x22, x11]$^T$), p={1, 2, 2, 4, 8, 16}, k=32, and α={0, 0, 0, 1, 1, 1} and the matrix $A''$ is given by Equation (19):

$$A'' = \begin{bmatrix} 1 & 1 & 2 & 4 & 7 & 13 \\ 0 & 1 & 1 & 2 & 4 & 7 \\ 0 & 0 & 1 & 1 & 2 & 4 \\ 0 & 0 & 0 & 1 & 1 & 2 \\ 0 & 0 & 0 & 0 & 1 & 1 \\ 0 & 0 & 0 & 0 & 0 & 1 \end{bmatrix} \quad (19)$$

A sufficient and necessary condition for the linear programming relaxation of the integer linear programming problem to have a solution is that the maximum attained by the linear program problem be greater than or equal to k, where the linear programming problem can be stated as: maximize px, subject to $A''X \leq A''\alpha$, $x\epsilon\{0, R^+\}^n$.

Using linear programming techniques, it can be shown that the maximum attained value is 37, which exceeds the desired k=32. This means that the linear programming relaxation of the integer linear programming problem has a solution, and therefore an interval modulation code in accordance with the invention, and in accordance with the given code parameters, may exist.

E. Efficient Procedure for Solving the Linear Programming Problem

In another aspect of the present invention, a simplified technique is presented for solving the linear programming problem that arises in the previous section. The simplified technique involves minimizing linear functions over a Generalized Fibonacci Polyhedra. In formal terms, the linear programming problem to be solved in determining whether a suitable interval modulation code exists is given by: Given $K\epsilon\{0, 1\}^m$ and $\alpha\epsilon\{0, R^+\}^n$ and $c\epsilon R^n$, find C=max cy subject to $y\epsilon\Gamma(K, \alpha)$.

In accordance with the invention, the C terms can be computed recursively as follows in Equation (20):

$$C^i = \begin{cases} \max\left(\sum_{j=1}^{m} K_j C^{i-j}, c_i\right) & m < i \leq n \\ \max\left(\sum_{j=1}^{i-1} K_j C^{i-j}, c_i\right) & 2 \leq i \leq m \\ \max(0, c_1) & i = 1 \end{cases} \quad (20)$$

where $i\epsilon\{1, 2, 3, \ldots, n\}$. Thus, $C^1$ is computed first, followed by $C^2$, $C^3$, and so forth. Then the value of C is computed by $$C = \sum_{i=1}^{n} \alpha_i C^i.$$

E.1 Example I

Returning to the example described previously, begin with a set of code parameters given by S={1, 2, 3}, $T_E$=7, $T_D$=8, and R=6/7=0.857. As noted above, the simplified solution provides a linear programming problem over a Generalized Fibonacci Polyhedra with the C terms computed as follows:

$$C1 = \max(0, c1) = \max(0, 1) = 1$$

$$C2 = \max(\Sigma_{j=1}^{1} K_j C(2-j), c2) = \max(1, 2) = 2$$

$$C3 = \max(\Sigma_{j=1}^{2} K_j C(3-j), c3) = \max(1+2, 2) = 3$$

$$C4 = \max(\Sigma_{j=1}^{3} K_j C(4-j), c4) = \max(1+2+3, 4) = 6$$

$$C5 = \max(\Sigma_{j=1}^{3} K_j C(5-j), c5) = \max(2+3+6, 8) = 11$$

$$C6 = \max(\Sigma_{j=1}^{3} K_j C(6-j), c6) = \max(3+6+11, 16) = 20$$

$$C7 = \max(\Sigma_{j=1}^{3} K_j C(7-j), c7) = \max(6+11+20, 32) = 37$$

$$C8 = \max(\Sigma_{j=1}^{3} K_j C(8-j), c8) = \max(11+20+37, 64) = 68$$

which provides the result:

$$C = C6 + C7 + C8 = 20 + 37 + 68 = 125.$$

As noted previously, the value C=125 is less than the value k=128 needed for a solution to exist, given these code parameters. Therefore, it is apparent that there is no interval modulation code that satisfies these code parameters. This result, using the simplified technique, is consistent with the value that would be determined using conventional LP solvers.

E.2 Example II

Returning to the second example code parameters, begin with the set of code parameters given in Section C.3 above, where the symbol set S comprises S={1, 2, 3}, $T_E$=5, $T_D$=6, and R=4/5=0.80. Again, it is noted that this linear programming problem is a linear programming problem over a Generalized Fibonacci Polyhedra that can be solved with the simplified technique described above. Using this technique provides the following solution:

$$C1 = \max(0, p1) = \max(0, 1) = 1$$

$$C2 = \max(\Sigma_{j=1}^{1} K_j C(2-j), p2) = \max(1, 2) = 2$$

$$C3 = \max(\Sigma_{j=1}^{2} K_j C(3-j), p3) = \max(1+2, 2) = 3$$

$$C4 = \max(\Sigma1 =1^{3} K_j C(4-j), p4) = \max(1+2+3, 4) = 6$$

$$C5 = \max(\Sigma_{j=1}^{3} K_j C(5-j), p5) = \max(2+3+6, 8) = 11$$

$$C6 = \max(\Sigma_{j=1}^{3} K_j C(6-j), p6) = \max(3+6+11, 16) = 20$$

which provides the result:

$$C = C4 + C5 + C6 = 6 + 11 + 20 = 37.$$

The simplified computation provides the result that C=37. This is greater than the amount of k=32 required for a solution to exist. This result, which agrees with the result obtained using conventional LP solvers, indicates that the linear programming relaxation of the integer linear programming problem for this set of coding parameters may have a solution.

F. Efficient Procedure for Solving Linear Programming Relaxation of Integer Linear Program The integer linear programming problem described above can be solved using conventional ILP techniques and conventional ILP solvers. In another aspect of the present invention, a simplified computational technique is provided to determine a solution to the linear programming relaxation of the integer linear programming problem. It was noted above that this involves minimizing a linear function over the intersection of a Generalized Fibonacci Polyhedra and a hyperplane. Mathematically, the problem can be stated as follows.

It is given that $K \in \{0, 1\}^m$ and $\alpha \in \{0, R^+\}^n$ and $c \in R^n$ and $p \in R^n$, and $k \in R$. It is desired to find C=min cy subject to py=k and $y \in \Gamma(K, \alpha)$. Equivalently, the problem is to find C=min cy subject to py=k and $A''y \leq A''\alpha$, $y \in \{0, R^+\}^n$ where $A''$ is an n×n matrix such that $y \in \Gamma(K, \alpha)$ if and only if $A''y \leq A''\alpha$ and $y \in \{0, R^+\}^n$.

Next, let $\pi$ be the dual variable associated with the constraint py=k and let $\mu$ be the vector of dual variables associated with the constraints $A''y \leq A''\alpha$. Then the dual of the linear programming problem described above can be stated as follows: maximize $(\pi k + \|A''\alpha)$ subject to $(\pi p + \mu A'' \leq c)$, $\pi$ unrestricted, $\mu \in \{0, R^-\}^n$ The above stated problem can be decomposed as follows:

$$\max_{\pi \text{ unrestricted}} \left\{ \pi k + \left[ \max_{\text{subject to}} \begin{array}{c} \mu A^n \alpha \\ \mu A^n \leq c - \pi p \\ \mu \in \{0, R^-\}^n \end{array} \right] \right\}$$

Let $\bar{y}$ be the set of dual variables associated with the constraint $\mu A'' \leq c - \pi$. Then the inner linear program is replaced by its dual (that is, instead of minimizing the cost function, the negative of the cost function is maximized):

$$\max_{\pi \text{ unrestricted}} \left\{ \pi k - \left[ \max_{\text{subject to}} \begin{array}{c} (\pi p - c)\bar{y} \\ A^n \bar{y} \leq A^n \alpha \\ \bar{y} \in \{0, R^+\}^n \end{array} \right] \right\}$$

Next, functions are defined comprising $f(\pi) = \pi k$, $g(\pi) = \max(\pi p - c)y$ subject to $A''y \leq A''\alpha$, $y \in \{0, R+\}^n$ and $L(\pi) = f(\pi) - g(\pi)$. Using the results in the previous section, it is known that for any given value of $\pi$, $g(\pi) = \Sigma_{i=1}^{n} \alpha_i g_i(\pi))$, where:

$$g_i(\pi) = \begin{cases} \max\left(\sum_{j=1}^{m} K_{jgi-j}(\pi), \pi p_i - c_i\right) & m < i \leq n \\ \max\left(\sum_{j=1}^{i-1} K_{jgi-j}(\pi), \pi p_i - c_i\right) & 2 \leq i \leq m \\ \max(0, \pi p_1 - c_1) & i = 1 \end{cases}$$

It should be appreciated that $g(\pi) = L(\pi) - f(\pi)$ where $f(\pi) = \pi k$. The function f is linear and continuous and L is the Lagrangian Dual of the linear program problem and is thus piecewise linear, concave, and continuous. Therefore, the function g must be piecewise linear and convex. Using a similar argument, it is possible to show that g will be piecewise linear, convex and continuous. Those skilled in the art will understand that piecewise linear and continuous functions can be represented by a sequence of breakpoints (stored in sorted order) which partition the real axis into non-overlapping intervals. Within each interval the piecewise linear function is linear and this line can be represented using two parameters describing the slope and the intercept. Addition of two piecewise linear functions results in a piecewise linear function whose parametric representation can be computed in linear time (linear in the number of breakpoints). Similarly, the maximum of a linear function and a piecewise linear function is a piecewise linear function whose parametric representation can be computed in linear time (linear in the number of breakpoints). Therefore, the simplified solution technique in accordance with the present invention is to compute the p,representation of the terms g1, g2, . . . , gn and then compute the parametric representation of g and finally of L. Given the parametric representation of L, it is possible to determine the value of $\tau\tau$ that maximizes L and thus determine the maximum value of L.

F.1 Example I

Figure 8:
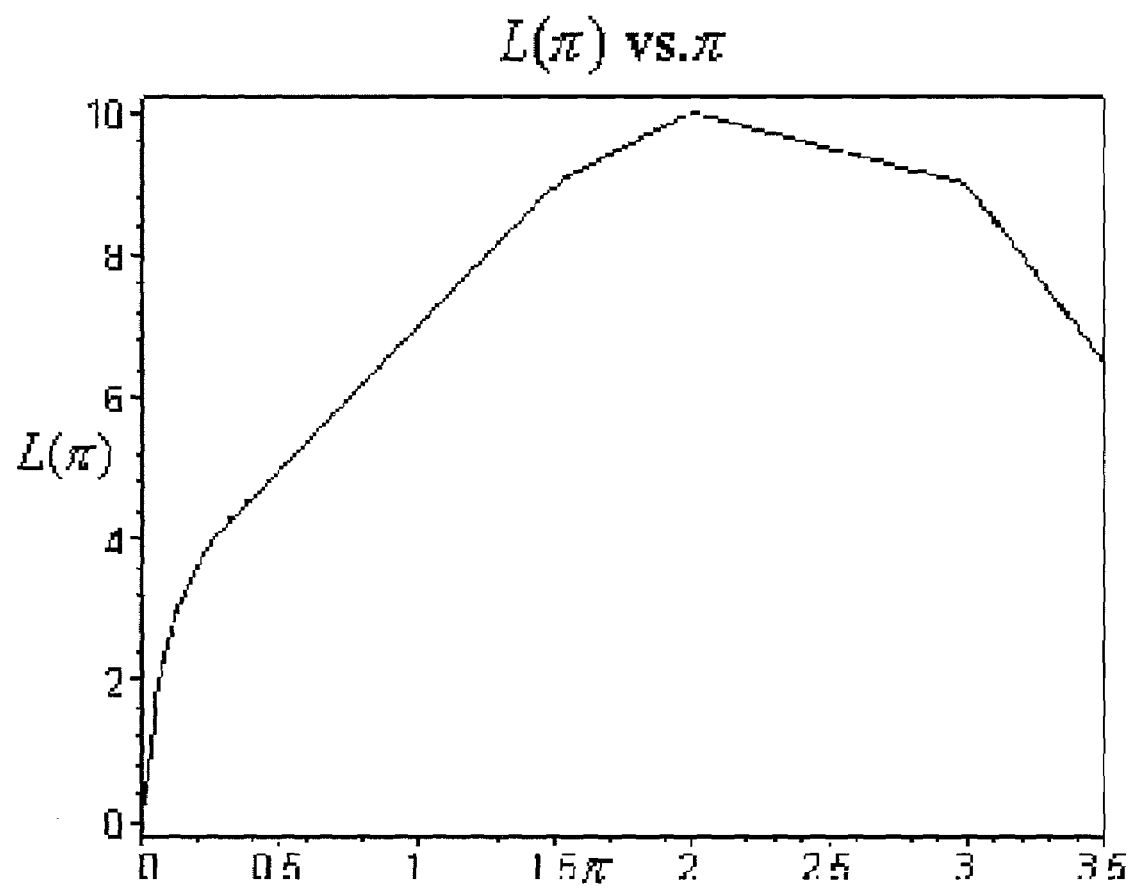
FIG. 8 is a plot of the Langrangian Dual that arises when we solve the Linear Programming Relaxation of the Integer Linear Program associated with code construction using the algorithm outlined in this patent.

Returning to the second example code parameters, described previously in Section C.3 above, where the symbol set S comprises S={1, 2, 3}, $T_E$=5, $T_D$=6, and R=4/5=0.80. In this example, the task is to solve the linear programming relaxation of the integer programming problem, finding the value C, where C is defined as comprising the problem statement: min cx subject to px=k and $A''x \leq A''\alpha$, $x\epsilon\{0, R^+\}''$. This problem is equivalent to maximizing $L(\tau\tau)=f(\tau\tau)-g(\tau\tau)$ where $\tau\tau$ is unrestricted, $f(\tau\tau)=\tau\tau k$, and $g(\tau\tau)$ is defined by $g(\tau\tau)=\max (\tau\tau p-c)x'$, subject to $A''x' \leq A''\alpha$, $x'\epsilon\{0, R^+\}''$. Using these definitions, the g1, g2, g3 . . . terms can be computed as follows:

$g1(\tau\tau)=\max\{0, p1\tau\tau-c1\}=\{0 \text{ for } \tau\tau \leq 1, \tau\tau-1 \text{ for } \tau\tau>1\}$, $g2(\tau\tau)=\max\{\Sigma_{j=1}^{1}K_j g_{2-j}(\tau\tau), \text{ or } p2-\tau\tau-c_2\}=\{0 \text{ for } \tau\tau \leq 1/2, 2\tau\tau-1 \text{ for } \tau\tau>1/2\}$ $g3(T)=\max\{\Sigma_{j=1}^{2}K_j g_{3-j}(\tau\tau), \text{ or } p3\tau\tau-c_3\}=\{0 \text{ for } \tau\tau \leq 1/2, 2\tau\tau-1 \text{ for } 1/2<\tau\tau \leq 1, 3\tau\tau-2 \text{ for } 1<\tau\tau\}$, $g4(\tau\tau)=\max\{\Sigma_{j=1}^{3}K_j g_{4-j}(\tau\tau), \text{ or } p4\tau\tau-c_4\}=\{0 \text{ for } \tau\tau \leq 1/4, 4\tau\tau-1 \text{ for } 1/4<\tau\tau \leq 3/2, 6\tau\tau-4 \text{ for } 3/2<\tau\tau\}$, $g5(\tau\tau)=\max\{\Sigma_{j=1}^{3}K_j g_{5-j}(\tau\tau), \text{ or } p5\tau\tau-c_5\}=\{0 \text{ for } \tau\tau \leq 1/8, 8\tau\tau-1 \text{ for } 1/8<\tau\tau \leq 2, 11\tau\tau-7 \text{ for } 2<\tau\tau\}$, $g6(\tau\tau)=\max\{\Sigma_{j=1}^{3}K_j g_{6-j}(\tau\tau), \text{ or } p6\tau\tau-c_6\}=\{0 \text{ for } \tau\tau \leq 1/16, 16\tau\tau-1 \text{ for } 1/16<\tau\tau \leq 3, 20\tau\tau-13 \text{ for } 3<\tau\tau\}$, and therefore $g(\tau\tau)=g4(\tau\tau)+g5(\tau\tau)+g6(\tau\tau)$. Given that $L(\tau\tau)=f(\tau\tau)-g(\tau\tau)$, it can be shown that the maximum value taken on by $L(\tau\tau)$ is ten (10) and this value occurs at $\tau\tau$=2. A plot of $L(\tau\tau)$ is shown in FIG. 8.

G. Applications and Embodiments

G.1 Encoding and Decoding System

Figure 9:
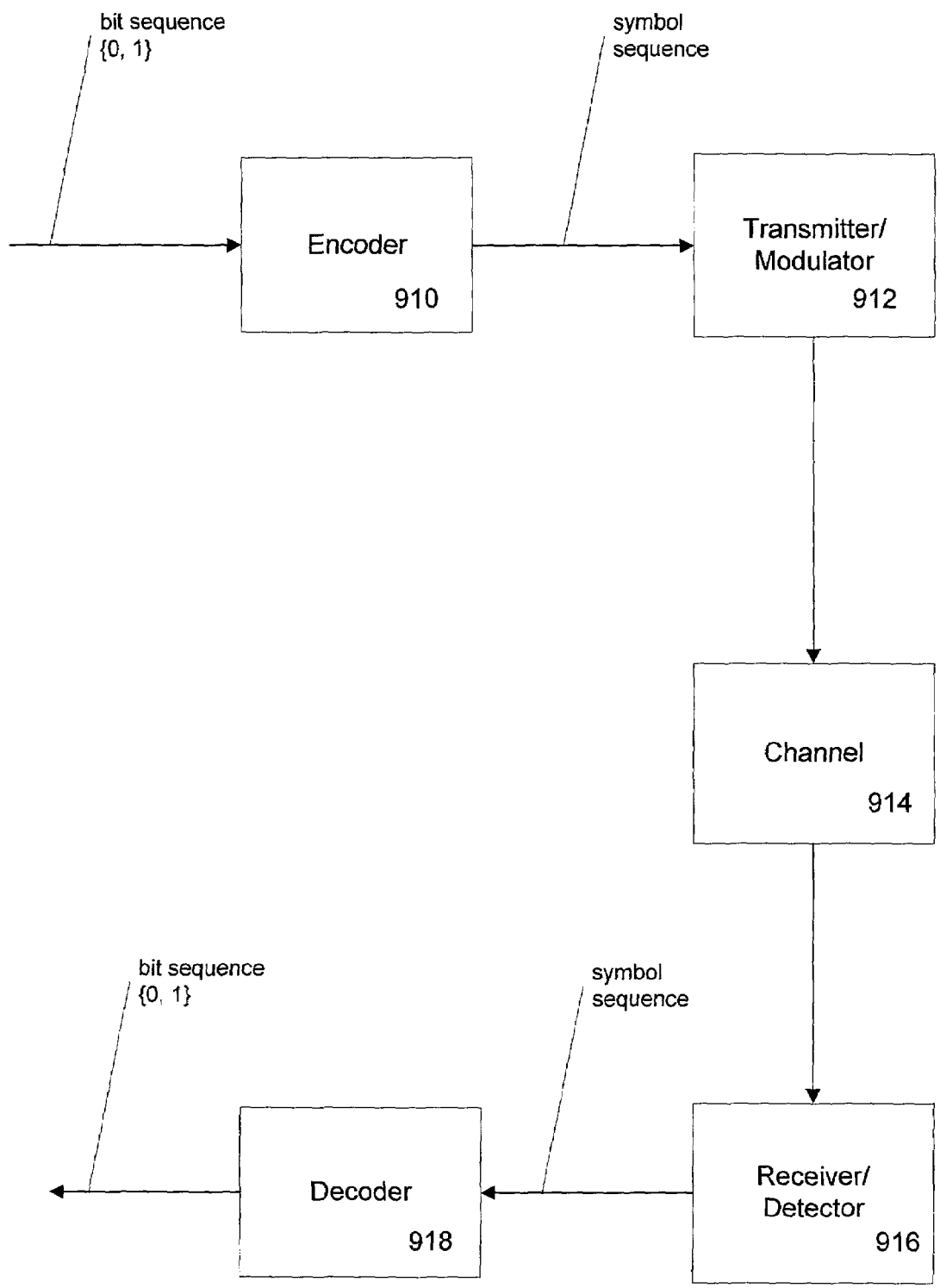
FIG. 9 is a schematic block diagram of a system that performs an encoding and decoding process in accordance with the present invention.

FIG. 9 is a schematic block diagram of a system that performs an encoding and decoding in accordance with the present invention. The system receives a sequence of bits {0, 1} into an encoder 910 that transforms the input (unconstrained) bit sequence into a symbol sequence that is encoded according to an Interval Modulation Code such as described above. The encoder can perform the transformation by utilizing a look-up table that implements the coding rules for Interval Modulation Coding in accordance with the present invention. Thus, the output of the encoder 910 is a symbol sequence.

The symbol sequence is next provided to a modulator 912 that prepares the symbol data for transmission over the data channel 914. For example, if the data channel comprises an optical media such as an optical fiber cable or an optical storage disc, then the modulator 912 will comprise a circuit and a laser module that produces laser pulses of light in accordance with the input symbols. If the data channel 914 comprises an electromagnetic transport, such as radio frequency (RF) signals, then the modulator 912 will comprise an RF transmitter device. The output of the modulator is transmitted over the data channel 914 in a suitable manner. For example, the data channel can comprise an optical fiber cable, or can comprise an optical storage media such as a CD data disc, or can comprise a conductive cable that carries electrical signals, or can comprise air through which RF telecommunications signals can travel.

After the encoded symbol sequence travels from the modulator 912 to the channel 914, the symbols are received at a receiver/detector 916. For example, in the case of an optical data channel, the receiver 916 might comprise a photodiode and associated circuitry to convert received light (laser) pulses into electrical signals. If the data channel involves RF transmission, then the receiver comprises an RF receiver that can receive the telecommunication waves of the RF transmission and can convert the transmission to a suitable electrical signal. The output of the receiver 916 is a symbol sequence that corresponds to the output of the encoder 910.

The symbol sequence from the receiver 916 is provided to a decoder 918 that transforms the encoded symbol sequence into a decoded (unconstrained) bit sequence that is decoded according to the inverse Interval Modulation Code that was utilized by the encoder 910. The decoder 918 can perform the transformation by utilizing a look-up table that implements the coding rules for Interval Modulation Coding in accordance with the present invention. In this way, the decoder 910 receives a symbol sequence that follows coding rules of an Interval Modulation Code and produces an output comprising a {0, 1} bit sequence.

Details of the FIG. 9 components can vary. For example, the look-up table processing can be implemented as a finite state machine, using a tree diagram such as illustrated in FIG. 6 and FIG. 7, to provide if-then processing on whatever data is received. Thus, the encoder 910 and decoder 918 perform the functions that were graphically illustrated by FIG. 6 and FIG. 7, respectively. Such logical processing operations can be implemented in software using if-then rules or program statements or in circuitry using suitable logic gates. The components illustrated in FIG. 9 can be implemented in a single integrated device, such as illustrated in FIG. 10 below, or the components can be separate components that nevertheless work cooperatively together to perform in accordance with the invention as described above.

G.2 Data Device

Figure 10:
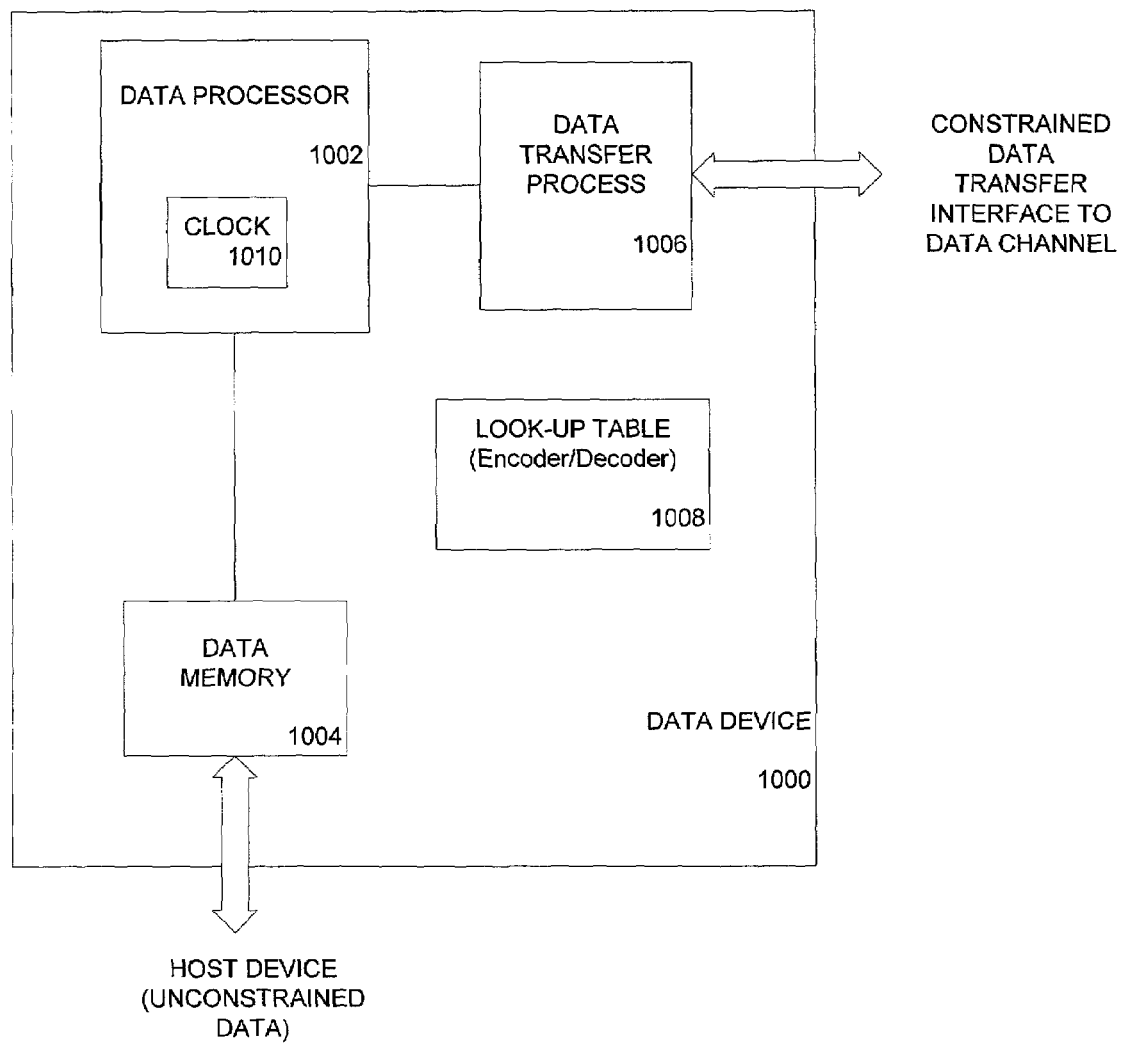
FIG. 10 is a schematic block diagram of a device that implements the Interval Modulation Coding scheme in accordance with the present invention.

FIG. 10 shows a data device 1000 that processes data in accordance with the present invention and provides an integrated device that can both encode and decode bit sequences in accordance with the invention. The data device 1000 can be integrated into, for example, a disk drive where the data channel is a disk media, or the data device can be integrated into a radio frequency telecommunications device, where the data channel comprises an RF signal. The data system from which the data device 1000 obtains data for encoding (or to which the data device provides decoded data) is referred to as a host device. The host device can comprise associated circuitry of, for example, the associated disk drive or RF transceiver. Data transfer to the data channel takes place using suitable equipment of the host device. For example, a data device 1000 for use with a disk media data channel would operate in conjunction with a disk drive interface, and a data device for use with a telecommunications system would operate in conjunction with RF transmitter and receiver circuitry of the system.

A data control processor 1002 of the data device 1000 interfaces to unconstrained data to and from a data memory 1004, and interfaces to constrained data to and from a data transfer process 1006. During data encoding, the data device 1000 receives unconstrained data, such as data words or graphics image data or the like, from a host device and temporarily stores the unconstrained data into the data memory 1004 of the device. The processor 1002 formats the unconstrained data and passes it to the data transfer process 1006, which transfers it to a data channel so that constrained data is produced from the data device 1000, for data storage or data transmission over the data channel. Thus, the output from the data transfer process 1006 is a data stream in which the intervals between data pulses are non-uniform.

Transmission over the data channel can comprise, for example, storage onto a magnetic disk or an optical storage disc, or can comprise transfer to telecommunications system circuitry for transmission over a telecommunications channel. In accordance with the invention, the data will be encoded using non-uniform data intervals to produce the constrained code. The coding scheme that specifies the mapping of data symbols onto input sequences of data bits can be contained in a look-up table 1008 or can be contained in the data memory of the data device. In either case, the data processor 1002 will consult the coding scheme to determine the appropriate processing (data encoding) that should occur.

During decoding of constrained data, the data device 1000 receives constrained data from a data channel, such as magnetic disk or optical storage disc or a telecommunications connection, into the data transfer process 1006. The constrained data is provided to the data control processor 1002, which decodes the data in accordance with the present invention and passes the unconstrained data to the data device memory 1004 for transfer to a host device or other processing units or accessories. Thus, the output of the output of the data transfer process 1006 is a stream of constrained data having non-uniform data intervals between data pulses and the output of the control processor 1002 is a stream of recovered data. The device can store a mapping of symbols onto the encoded data, comprising a decoding scheme, in a look up table 1008 or the decoding scheme can be stored in the data memory for use by the data processor.

The data device 1000 transfers data to and from the data channel(s) in accordance with a device clock, illustrated as a clock circuit 1010. The clock circuit can be implemented as an analog clock circuit that produces clock intervals as specified by the symbol set S, or the clock circuit can be implemented as a digital clock that produces clock intervals that are integer multiples of a base clock interval.

For example, when an analog clock circuit is used to measure non-uniform intervals of elapsed time, the symbol set S={1.00, 1.13, 1.27, 1.42, 1.60, 1.80, . . . } can be implemented with an analog clock that produces time intervals of {1.00, 1.13, 1.27, 1.42, 1.60, 1.80, . . . } for the base time interval (1.00). Alternatively, a digital clock can be used if it produces a sufficiently small minimum cycle time that can be used to generate the required non-uniform time intervals. For example, it should be apparent that or the symbol set S given above can be implemented by a high frequency digital clock that produces intervals comprising the set {100, 113, 127, 142, 160, 180, . . . }. In the latter case, the digital clock interval of {100} for the digital clock cycle time should be equal to the analog clock circuit interval of {1.00}. The clock 910 can be integrated into the data processor, if desired.

Those skilled in the art will understand that the look-up table 1008 comprises stored processing rules that, when executed, will implement the mapping from unconstrained data to constrained data and will implement the mapping from constrained data back to unconstrained data. It should be apparent that the look-up table or some similar structure that operates in a similar fashion will be provided in the encoder 910 and decoder 918 illustrated in FIG. 9. Accordingly, the encoder 910 and decoder 918 will include data storage containing the look-up table processing rules and a processor that can implement the look-up table processing rules to perform the encoding and decoding in accordance with the present invention. The look-up table and data processor can be implemented, for example, in an integrated circuit chip or as a processor and firmware combination.

G.3 Computing System to be Used for Code Construction

A variety of Linear Programming and Integer Linear Programming tools can be used to solve the Linear Programming and Integer Linear Programming Problems that arise in the context of determining feasibility and in the process of code construction. For example "LINDO" and "LINGO" from Lindo Systems, Inc., Chicago, Ill., USA can be utilized. Other ILP (and Linear Programming) solution tools are described at the World Wide Web location of the "Linear Programming FAQ", which is currently at the URL address of www.faqs.org/faqs/linear-programming-faq/.

The software tools can be used on a variety of hardware platforms. A conventional desktop computer system can be used to solve the various linear programming problems described above and to construct suitable interval modulation codes. Those skilled in the art will also be able to construct suitable encoding and decoding trees using such a computer to further the construction of interval modulation codes. An example of a suitable conventional computer is illustrated in FIG. 11 and is described below.

Figure 11:
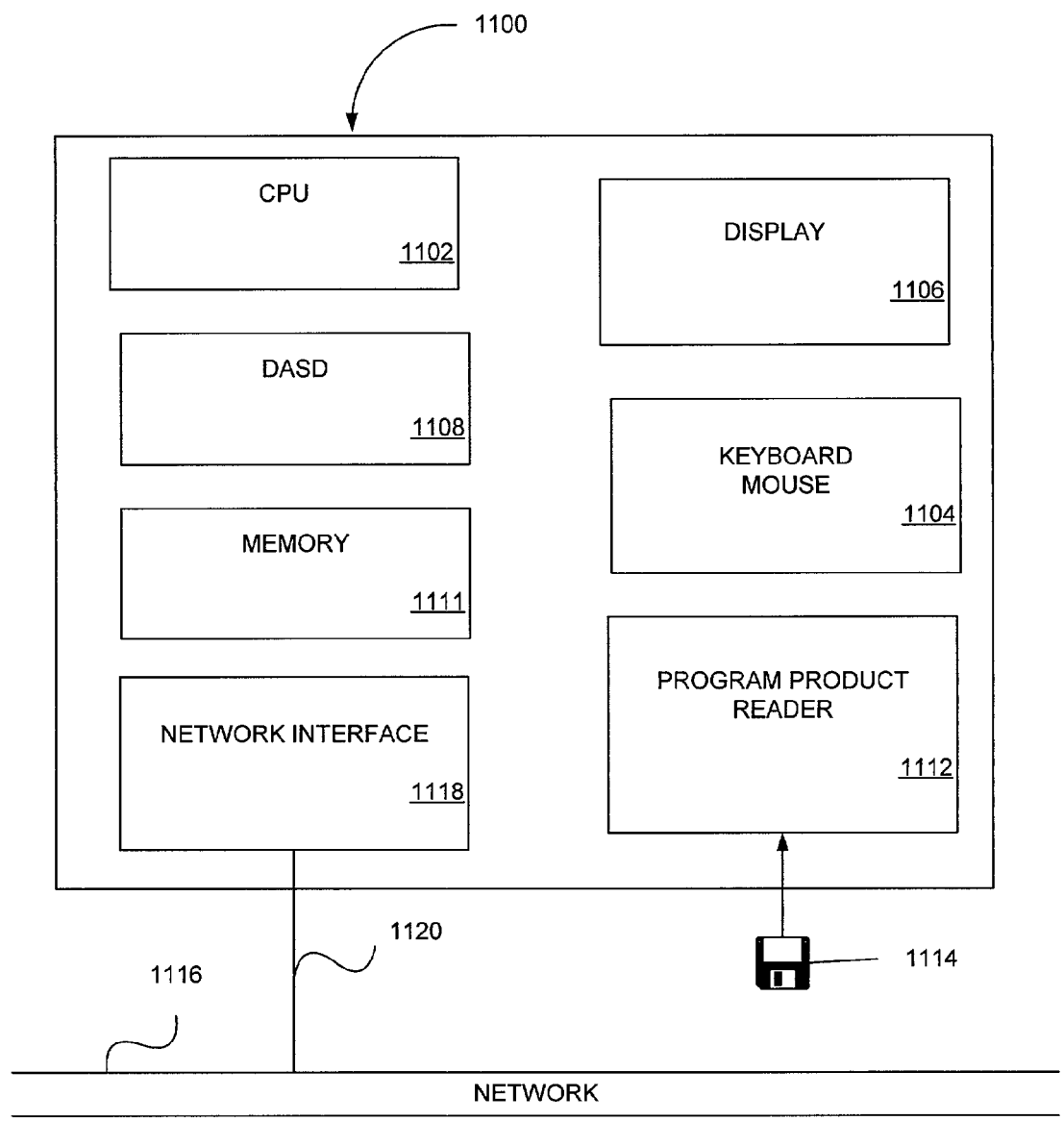
FIG. 11 is a schematic block diagram of a computing device that performs code construction in accordance with the present invention.

FIG. 11 shows an exemplary computer 1100 such as might comprise a computer system for executing the linear programming tools described above. The computer 1100 can be a stand-alone computer or can be operated in a networked environment that permits communication with other computers. The computer 1100 operates under control of a central processor unit (CPU) 1102, such as a "Pentium" microprocessor and associated integrated circuit chips, available from Intel Corporation of Santa Clara, Calif., USA. A computer user can input commands and data from a keyboard and computer mouse 1104, and can view inputs and computer output at a display 1106. The display is typically a video monitor or flat panel display. The computer 1100 also includes a direct access storage device (DASD) 1108, such as a hard disk drive. The memory 1111 typically comprises volatile semiconductor random access memory (RAM). Each computer preferably includes a program product reader 1112 that accepts a program product storage device 1114, from which the program product reader can read data (and to which it can optionally write data). The program product reader can comprise, for example, a disk drive, and the program product storage device can comprise removable storage media such as a magnetic floppy disk, a CD-R disc, a CD-RW disc, or DVD disc.

The computer 1100 can communicate with any other computers, if networked, over a computer network 1116 (such as the Internet or an intranet) through a network interface 1118 that enables communication over a connection 1120 between the network 1116 and the computer. The network interface 1118 typically comprises, for example, a Network Interface Card (NIC) or a modem that permits communications over a variety of networks.

The CPU 1102 operates under control of programming steps that are temporarily stored in the memory 1111 of the computer 1100. When the programming steps are executed, the computer performs its functions. Thus, the programming steps implement the functionality of the application 440. The programming steps can be received from the DASD 1108, through the program product storage device 1114, or through the network connection 1120. The program product storage drive 1112 can receive a program product 1114, read programming steps recorded thereon, and transfer the programming steps into the memory 1111 for execution by the CPU 1102. As noted above, the program product storage device can comprise any one of multiple removable media having recorded computer-readable instructions, including magnetic floppy disks and CD-ROM storage discs. Other suitable program product storage devices can include magnetic tape and semiconductor memory chips. In this way, the processing steps necessary for operation in accordance with the invention can be embodied on a program product.

Alternatively, the program steps can be received into the operating memory 1111 over the network 1116. In the network method, the computer receives data including program steps into the memory 1111 through the network interface 1118 after network communication has been established over the network connection 1120 by well-known methods that will be understood by those skilled in the art without further explanation. The program steps are then executed by the CPU 1102 thereby comprising a computer process.

Furthermore the methods and operations covered by this disclosure can be implemented using different programming languages such as C, C++ or Java, or they can be implemented in different Symbolic Computation Packages like "Mathematica" from Wolfram Research Inc., Urbana, Ill. or "Maple" from Waterloo Maple Inc., Ontario, Canada. Again these implementations can be designed to run on a variety of hardware platforms. Accordingly, the invention described herein has application to techniques for determining code feasibility and code construction, regardless of what implementation or method makes use of these techniques.

Thus, described above is a new modulation scheme that is defined by a finite set of permissible time intervals. The set of permissible time intervals is not required to consist of consecutive integer multiples of some constant. Rather, the time intervals can be non-uniform. A new modulation scheme is described, wherein the non-uniform intervals can be chosen in accordance with a probabilistic model of measurement error or can be chosen in accordance with other engineering constraints. The new modulation scheme with non-uniform intervals can eliminate the need for complex resynchronization circuitry, such as phase locked loops, because the intervals are chosen taking into account the probabilistic model of measurement error. The new modulation scheme can also eliminate the need for run length limited coding schemes. In addition, the new modulation scheme can provide higher storage density or transmission rates. Also described is a method for computing the maximum achievable rate R* given a set of permissible time intervals. A new coding method was described, based on variable-length-to-variable-length prefix-free codes that map bits to non-uniform symbols. This coding method was referred to above as an Interval Modulation Code. The hardware implementations of the Interval Modulation codes can comprise various forms such as lookup tables, finite state machines, or trees. A software implementation of the codes can take various forms, such as if-then-else statements.

Also disclosed is a new method for constructing Interval Modulation Codes given parameters that define the set of permissible time intervals, the encoder and decoder delay, and the desired data transmission rate. This method is based on reducing the code construction problem to Integer Linear Programming. The description also provides a new method for determining if an Interval Modulation Code might exist, given parameters that define the performance of the Interval Modulation Code. This method entails solving the relaxation of the Integer Linear Program problem to a Linear Program problem. The problem of determining if the Linear Programming Relaxation of the Integer Linear Program is feasible is reduced to another Linear Program. The description above also includes a new method of solving the linear program existence problem that is based on a new method for maximizing linear functions over a Generalized Fibonacci Polyhedra. The description above also includes a new method for solving the linear programming relaxation of the Integer Linear Program code construction problem. This new method is based on minimizing linear functions over the intersection of a Fibonacci Polyhedra and a hyperplane. The implementation of the various linear program problems can occur with different computing platforms. The methods to solve the relaxation of the Integer Linear Programming problem, the method involving the Generalized Fibonacci Polyhedra, and the methods involving the intersection of the Fibonacci Polyhedra and a hyperplane can be extended to provide other methods for solving the ILP code construction problem. Systems can be constructed to utilize the modulation scheme described herein, such as systems that include encoders, modulators, receivers, and decoders, and that transfer data to and from data channels comprising storage media and telecommunications paths.

We claim:

1. A method of modulating data for transmission over a data channel, the method comprising:
 receiving unconstrained data comprising a sequence of data bits;
 mapping the unconstrained data according to a modulation coding scheme that provides data intervals that are not consecutive integer multiples of a predetermined constant; and
 producing an encoded sequence of constrained data bits that are modulated in accordance with the data intervals.

2. A method as defined in claim 1, wherein the data intervals comprise a set of non-uniform time intervals.

3. A method as defined in claim 1, further including transmitting the encoded data bits over the data channel.

4. A method as defined in claim 1, wherein the data intervals are determined as a function of a probabilistic model of clock measurement error.

5. A method as defined in claim 3, wherein the modulation coding scheme is not constrained by a run length limit.

6. A method as defined in claim 1, wherein the data channel comprises a storage medium.

7. A method as defined in claim 1, wherein the data channel comprises a telecommunication path.

8. A method as defined in claim 1, wherein the modulation coding scheme provides a variable-length-to-variable-length prefix-free code.

9. A method as defined in claim 1, wherein encoding further comprises utilizing a modulation coding scheme that maps encoding symbols onto data bits such that the encoding symbols define a code symbol set S of non-uniform intervals and the symbol mapping is in accordance with a selected encoder delay time $T^E$, a selected decoder delay time $T_D$, and a desired data transfer rate R.

10. A method as defined in claim 9, wherein the modulation coding scheme is constructed in accordance with an integer linear programming problem in accordance with code parameters specified by the S, $T_E$, $T_D$, and R specifications.

11. A method as defined in claim 9, wherein a maximum achievable data transfer rate R* is defined by $$R^* = \lim_{T \to \infty} \frac{\log_2(\overline{N}_s(T))}{T}$$

where the term $\overline{N}_S(T)$ is defined to be the number of sequences constructed using the symbol set S of length T.

12. A method as defined in claim 9, wherein the modulation coding scheme is specified in accordance with an integer linear programming problem, further comprising determining if a non-uniform interval modulation code exists given the S, $T_E$, $T_D$, and R specifications by solving the Linear Programming Relaxation of the integer linear programming problem.

13. A method as defined in claim 12, wherein the Linear Programming Relaxation problem is solved by maximizing linear functions over a Generalized Fibonacci Polyhedra.

14. A method as defined in claim 10, wherein the integer linear programming problem is solved by minimizing linear functions over an intersection of a Fibonacci Polyhedra and a hyperplane.

15. A method of modulating data received over a data channel, the method comprising:
receiving constrained data comprising a sequence of data bits that are modulated in accordance with a coding scheme that provides data intervals that are not consecutive integer multiples of a predetermined constant;
mapping the constrained data onto a modulation coding scheme that includes symbols corresponding to the data intervals; and
producing a decoded sequence of unconstrained data bits.

16. A method as defined in claim 15, wherein the data intervals comprise a set of non-uniform time intervals.

17. A method as defined in claim 15, wherein the data intervals are determined as a function of a probabilistic model of clock measurement error.

18. A method as defined in claim 17, wherein the modulation coding scheme is not constrained by a run length limit.

19. A method as defined in claim 15, wherein the data channel comprises a storage medium.

20. A method as defined in claim 15, wherein the data channel comprises a telecommunication path.

21. A method as defined in claim 15, wherein the modulation coding scheme provides a variable-length-to-variable-length prefix-free code.

22. A method as defined in claim 15, wherein producing decoded data further comprises utilizing a modulation coding scheme that maps coded symbols onto data bits such that the coded symbols define a code symbol set S of non-uniform intervals, and the coded symbol mapping is in accordance with a selected encoder delay time $T_E$, a selected decoder delay time $T_D$, and a desired data transfer rate R.

23. A method as defined in claim 21, wherein the modulation coding scheme is constructed in accordance with an integer linear programming problem in accordance with code parameters specified by the S, $T_E$, $T_D$, and R specifications.

24. A method as defined in claim 21, wherein a maximum achievable data transfer rate R* is defined by $$R^* = \lim_{T \to \infty} \frac{\log_2(\overline{N}_s(T))}{T}$$

where the term $\overline{N}_S(T)$ is defined to be the number of sequences constructed using the symbol set S of length T.

25. A method as defined in claim 21, wherein the modulation coding scheme is specified in accordance with an integer linear programming problem, further comprising determining if a non-uniform interval modulation code exists given the S, $T_E$, $T_D$, and R specifications by solving the Linear Programming Relaxation of the integer linear programming problem.

26. A method as defined in claim 24, wherein the Linear Programming Relaxation problem is solved by maximizing linear functions over a Generalized Fibonacci Polyhedra.

27. A method as defined in claim 22, wherein the integer linear programming problem is solved by minimizing linear functions over an intersection of a Fibonacci Polyhedra and a hyperplane.

28. A data device comprising:
a processor; and
a data transfer interface adapted to transfer data to and from a data channel;
wherein the processor controls the transfer of data across the data transfer interface so the data device receives unconstrained data comprising a sequence of data bits, maps the unconstrained data onto a modulation coding scheme that provides data intervals that are not consecutive integer multiples of a predetermined constant, and produces an encoded sequence of constrained data bits that are modulated in accordance with the data intervals.

29. A data device as defined in claim 28, wherein the data intervals comprise a set of non-uniform time intervals.

30. A data device as defined in claim 28, wherein the non-uniform data intervals are determined as a function of a probabilistic model of clock measurement error.

31. A data device as defined in claim 30, wherein the modulation coding scheme is not constrained by a run length limit.

32. A data device as defined in claim 28, wherein the data channel comprises a storage medium.

33. A data device as defined in claim 28, wherein the data channel comprises a telecommunication path.

34. A data device as defined in claim 28, wherein the modulation coding scheme provides a variable-length-to-variable-length prefix-free code.

35. A data device as defined in claim 28, wherein producing decoded data further comprises utilizing a modulation coding scheme that maps encoding symbols onto data bits such that the encoding symbols define a code symbol set S of non-uniform intervals and the symbol mapping is in accordance with a selected encoder delay time $T_E$, a selected decoder delay time $T_D$, and a desired data transfer rate R.

36. A data device as defined in claim 35, wherein the modulation coding scheme is constructed in accordance with an integer linear programming problem in accordance with code parameters specified by the S, $T_E$, $T_D$, and R specifications.

37. A data device as defined in claim 35, wherein a maximum achievable data transfer rate R* is defined by $$R^* = \lim_{T \to \infty} \frac{\log_2(\overline{N}_s(T))}{T}$$

where the term $\overline{N}_S(T)$ is defined to be the number of sequences constructed using the symbol set S of length T.

38. A data device as defined in claim 35, wherein the modulation coding scheme is specified in accordance with an integer linear programming problem, further comprising determining if a non-uniform interval modulation code exists given the S, $T_E$, $T_D$, and R specifications by solving the Linear Programming Relaxation of the integer linear programming problem.

39. A data device as defined in claim 38, wherein the Linear Programming Relaxation problem is solved by maximizing linear functions over a Generalized Fibonacci Polyhedra.

40. A data device as defined in claim 36, wherein the integer linear programming problem is solved by minimizing linear functions over an intersection of a Fibonacci Polyhedra and a hyperplane.

41. A system comprising:
a data encoder;
a modulator;
a receiver/detector; and
a data decoder;
wherein the data encoder receives unconstrained data comprising a sequence of data bits and maps the unconstrained data onto a modulation coding scheme that provides data intervals that are not consecutive integer multiples of a predetermined constant to produce constrained data such that the constrained data is provided to the modulator for transfer over a data channel, and wherein the receiver/detector receives constrained data over the data channel and provides the constrained data to the data decoder, which receives the constrained data that comprises a sequence of data bits that are modulated in accordance with a modulation coding scheme that provides data intervals that are not consecutive integer multiples of a predetermined constant and maps the constrained data onto the modulation coding scheme so as to produce a decoded sequence corresponding to the unconstrained data bits.

42. A system as defined in claim 41, wherein the data intervals comprise a set of non-uniform time intervals.

43. A system as defined in claim 41, wherein the non-uniform data intervals are determined as a function of a probabilistic model of clock measurement error.

44. A system as defined in claim 43, wherein the modulation coding scheme is not constrained by a run length limit.

45. A system as defined in claim 41, wherein the data channel comprises a storage medium.

46. A system as defined in claim 41, wherein the data channel comprises a telecommunication path.

47. A system as defined in claim 41, wherein the modulation coding scheme provides a variable-length-to-variable-length prefix-free code.

48. A system as defined in claim 41, wherein producing decoded data further comprises utilizing a modulation coding scheme that maps encoding symbols onto data bits such that the encoding symbols define a code symbol set S of non-uniform intervals and the symbol mapping is in accordance with a selected encoder delay time $T_E$, a selected decoder delay time $T_D$, and a desired data transfer rate R.

49. A system as defined in claim 48, wherein the modulation coding scheme is constructed in accordance with an integer linear programming problem in accordance with code parameters specified by the S, $T_E$, $T_D$, and R specifications.

50. A system as defined in claim 48, wherein a maximum achievable data transfer rate R* is defined by $$R^* = \lim_{T \to \infty} \frac{\log_2(\overline{N}_s(T))}{T}$$

where the term $\overline{N}_S(T)$ is defined to be the number of sequences constructed using the symbol set S of length T.

51. A system as defined in claim 48, wherein the modulation coding scheme is specified in accordance with an integer linear programming problem, further comprising determining if a non-uniform interval modulation code exists given the S, $T_E$, $T_D$, and R specifications by solving the Linear Programming Relaxation of the integer linear programming problem.

52. A system as defined in claim 51, wherein the Linear Programming Relaxation problem is solved by maximizing linear functions over a Generalized Fibonacci Polyhedra.

53. A system as defined in claim 49, wherein the integer linear programming problem is solved by minimizing linear functions over an intersection of a Fibonacci Polyhedra and a hyperplane.

54. A system comprising:
a processor; and
data storage containing a set of processing rules that are performed by the processor to implement a data encoder that processes unconstrained data comprising a sequence of data bits and maps the unconstrained data onto a modulation coding scheme that provides data intervals that are not consecutive integer multiples of a predetermined constant to produce constrained data, and implements a data decoder that processes constrained data that comprises a sequence of data bits that are modulated in accordance with the data intervals and maps the constrained data onto the modulation coding scheme so as to produce a decoded sequence corresponding to the unconstrained data bits.

55. A system as defined in claim 54, wherein the data intervals comprise a set of non-uniform time intervals.

56. A system as defined in claim 54, wherein the data intervals are determined as a function of a probabilistic model of clock measurement error.

57. A system as defined in claim 56, wherein the modulation coding scheme is not constrained by a run length limit.

58. A system as defined in claim 54, wherein the data channel comprises a storage medium.

59. A system as defined in claim 54, wherein the data channel comprises a telecommunication path.

60. A system as defined in claim 54, wherein the modulation coding scheme provides a variable-length-to-variable-length prefix-free code.

61. A system as defined in claim 54, wherein producing decoded data further comprises utilizing a modulation coding scheme that maps encoding symbols onto data bits such that the encoding symbols define a code symbol set S of non-uniform intervals and the symbol mapping is in accordance with a selected encoder delay time $T_E$, a selected decoder delay time $T_D$, and a desired data transfer rate R.

62. A system as defined in claim 61, wherein the modulation coding scheme is constructed in accordance with an integer linear programming problem in accordance with code parameters specified by the S, $T_E$, $T_D$, and R specifications.

63. A system as defined in claim 61, wherein a maximum achievable data transfer rate R* is defined by $$R^* = \lim_{T \to \infty} \frac{\log_2(\overline{N}_s(T))}{T}$$

where the term $\overline{N}_S(T)$ is defined to be the number of sequences constructed using the symbol set S of length T.

64. A system as defined in claim 61, wherein the modulation coding scheme is specified in accordance with an integer linear programming problem, further comprising determining if a non-uniform interval modulation code exists given the S, $T_E$, $T_D$, and R specifications by solving the Linear Programming Relaxation of the integer linear programming problem.

65. A system as defined in claim 64, wherein the Linear Programming Relaxation problem is solved by maximizing linear functions over a Generalized Fibonacci Polyhedra.

66. A system as defined in claim 62, wherein the integer linear programming problem is solved by minimizing linear functions over an intersection of a Fibonacci Polyhedra and a hyperplane.

* * * * *